United States Patent
Yamazaki et al.

(10) Patent No.: US 6,316,810 B1
(45) Date of Patent: Nov. 13, 2001

(54) DISPLAY SWITCH WITH DOUBLE LAYERED GATE INSULATION AND RESINOUS INTERLAYER DIELECTRIC

(75) Inventors: Shunpei Yamazaki, Tokyo; Satoshi Teramoto, Kanagawa; Jun Koyama, Kanagawa; Yasushi Ogata, Kanagawa; Masahiko Hayakawa, Kanagawa; Mitsuaki Osame, Kanagawa, all of (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/350,176

(22) Filed: Jul. 9, 1999

Related U.S. Application Data

(62) Division of application No. 08/783,866, filed on Jan. 16, 1997, now Pat. No. 5,985,740.

(30) Foreign Application Priority Data

Jan. 19, 1996 (JP) ..................................... 8-026210

(51) Int. Cl.[7] ..................................... H01L 29/00
(52) U.S. Cl. ..................... 257/347; 257/59; 257/72; 257/408; 257/410; 257/411; 257/353
(58) Field of Search .................. 257/48–66, 72, 257/347–355, 408, 410, 411, 353

(56) References Cited

U.S. PATENT DOCUMENTS

| Re. 28,385 | 4/1975 | Mayer . |
| Re. 28,386 | 4/1975 | Heiman et al. . |
| 3,389,024 | 6/1968 | Schimmer . |
| 4,277,884 | 7/1981 | Hsu . |
| 4,300,989 | 11/1981 | Chang . |
| 4,309,224 | 1/1982 | Shibata . |

(List continued on next page.)

FOREIGN PATENT DOCUMENTS

| 0178447 | 4/1986 | (EP) . |
| 60-105216 | 10/1985 | (JP) . |
| 61-063017 | 4/1986 | (JP) . |
| 62-169356 | 7/1987 | (JP) . |
| 1-118714 | 7/1989 | (JP) . |
| 1-187874 | 7/1989 | (JP) . |

(List continued on next page.)

OTHER PUBLICATIONS

Liu et al., Applied Physics Letters, vol. 55, Aug. 14, 1989, pp. 660–662.
Liu et al., Applied Physics Letters, vol. 62, May 17, 1993, pp. 2554–2556.
Erokhin, Applied Physics Letters, vol. 63, Dec. 6, 1993, pp. 3173–3175.
Boyd et al., Applied Physics Letters, vol. 41, Jul. 15, 1982, pp. 162–164.

(List continued on next page.)

*Primary Examiner*—Fetsum Abraham
(74) *Attorney, Agent, or Firm*—Nixon Peabody LLP; Jeffrey L. Costelli

(57) ABSTRACT

Concentration of metal element which promotes crystallization of silicon and which exists within a crystal silicon film obtained by utilizing the metal element is reduced. A first heat treatment for crystallization is implemented after introducing nickel element to an amorphous silicon film 103. Then, after obtaining the crystal silicon film, another heat treatment is implemented within an oxidizing atmosphere at a temperature higher than that of the previous heat treatment. At this time, HCl or the like is added to the atmosphere. A thermal oxide film 106 is formed in this step. At this time, gettering of the nickel element into the thermal oxide film 106 takes place. Next, the thermal oxide film 106 is removed. Thereby, a crystal silicon film 107 having low concentration of the metal element and a high crystalinity can be obtained.

50 Claims, 11 Drawing Sheets

U.S. PATENT DOCUMENTS

| | | |
|---|---|---|
| 4,331,709 | 5/1982 | Risch et al. . |
| 3,783,049 | 1/1974 | Sandera . |
| 4,059,461 | 11/1977 | Zeiger et al. . |
| 4,086,020 | 4/1978 | Reuschel . |
| 4,132,571 | 1/1979 | Cuomo et al. . |
| 4,174,217 | 11/1979 | Flatley . |
| 4,226,898 | 10/1980 | Ovshinsky . |
| 4,231,809 | 11/1980 | Schmidt . |
| 4,271,422 | 6/1981 | Ipri . |
| 4,379,020 | 4/1983 | Glaeser . |
| 4,409,724 | 10/1983 | Tasch et al. . |
| 4,472,458 | 9/1984 | Sirinyan et al. . |
| 4,481,121 | 11/1984 | Barthel . |
| 4,534,820 | 8/1985 | Mori et al. . |
| 4,544,418 | 10/1985 | Gibbons . |
| 4,546,376 | 10/1985 | Nakata et al. . |
| 4,597,160 | 7/1986 | Ipri . |
| 4,634,473 | 1/1987 | Swartz et al. . |
| 4,735,824 | 4/1988 | Yamabe et al. . |
| 4,755,481 | 7/1988 | Faraone . |
| 4,911,781 | 3/1990 | Fox et al. . |
| 4,959,247 | 9/1990 | Moser et al. . |
| 4,959,700 | 9/1990 | Yamazaki . |
| 4,996,077 | 2/1991 | Moslehi et al. . |
| 4,996,523 | 2/1991 | Bell et al. . |
| 5,043,224 | 8/1991 | Jaccodine et al. . |
| 5,075,259 | 12/1991 | Moran . |
| 5,089,441 | 2/1992 | Moslehi ............................. 438/800 |
| 5,112,764 | 5/1992 | Mitra et al. . |
| 5,145,808 | 9/1992 | Sameshima et al. . |
| 5,147,826 | 9/1992 | Liu . |
| 5,173,446 | 12/1992 | Asakawa et al. . |
| 5,200,630 | 4/1993 | Nakamura et al. . |
| 5,221,423 | 6/1993 | Sugino . |
| 5,225,355 | 7/1993 | Sugino . |
| 5,244,836 | 9/1993 | Lim . |
| 5,254,480 | 10/1993 | Tran . |
| 5,262,350 | 11/1993 | Yamazaki et al. . |
| 5,262,654 | 11/1993 | Yamazaki . |
| 5,275,851 | 1/1994 | Fonash et al. . |
| 5,278,093 | 1/1994 | Yonehara . |
| 5,289,030 | 2/1994 | Yamazaki et al. . |
| 5,296,405 | 3/1994 | Yamazaki et al. . |
| 5,298,075 | 3/1994 | Lagendijk et al. . |
| 5,308,998 | 5/1994 | Yamazaki et al. . |
| 5,313,075 | 5/1994 | Zhang et al. . |
| 5,352,291 | 10/1994 | Zhang et al. . |
| 5,354,697 | 10/1994 | Oostra et al. . |
| 5,358,907 | 10/1994 | Wong . |
| 5,366,926 | 11/1994 | Mei et al. . |
| 5,387,530 | 2/1995 | Doyle et al. . |
| 5,403,772 | 4/1995 | Zhang et al. ...................... 438/166 |
| 5,424,230 | 6/1995 | Wakai . |
| 5,426,064 | 6/1995 | Zhang et al. ...................... 438/166 |
| 5,470,763 * | 11/1995 | Hamada ............................. 257/66 |
| 5,480,811 | 1/1996 | Chiang et al. . |
| 5,481,121 | 1/1996 | Zhang et al. ...................... 257/64 |
| 5,488,000 | 1/1996 | Zhang et al. ...................... 438/166 |
| 5,492,843 | 2/1996 | Adachi et al. ..................... 438/479 |
| 5,501,989 | 3/1996 | Takayama et al. ................. 438/155 |
| 5,504,019 | 4/1996 | Miyasaka et al. . |
| 5,508,207 | 4/1996 | Horai et al. . |
| 5,508,533 | 4/1996 | Takemura .......................... 257/64 |
| 5,529,937 | 6/1996 | Zhang et al. ...................... 438/471 |
| 5,530,266 | 6/1996 | Yonehara et al. . |
| 5,531,182 | 7/1996 | Yonehara . |
| 5,534,716 | 7/1996 | Takemura .......................... 257/72 |
| 5,543,352 | 8/1996 | Ohtani et al. ...................... 438/487 |
| 5,550,070 | 8/1996 | Funai et al. . |
| 5,563,426 | 10/1996 | Zhang et al. ...................... 257/66 |
| 5,569,610 | 10/1996 | Zhang et al. ...................... 438/166 |
| 5,569,936 | 10/1996 | Zhang et al. ...................... 257/66 |
| 5,580,792 | 12/1996 | Zhang et al. ...................... 438/166 |
| 5,580,815 | 12/1996 | Hsu et al. . |
| 5,585,291 | 12/1996 | Ohtani et al. ..................... 438/486 |
| 5,589,694 | 12/1996 | Takayama et al. ................. 257/359 |
| 5,595,923 | 1/1997 | Zhang et al. ...................... 438/162 |
| 5,595,944 | 1/1997 | Zhang et al. ...................... 438/158 |
| 5,604,360 | 2/1997 | Zhang et al. ...................... 257/72 |
| 5,605,846 | 2/1997 | Ohtani et al. ..................... 438/487 |
| 5,606,179 | 2/1997 | Yamazaki et al. ................. 257/79 |
| 5,608,232 | 3/1997 | Yamazaki et al. ................. 257/66 |
| 5,612,250 | 3/1997 | Ohtani et al. ..................... 438/795 |
| 5,614,426 | 3/1997 | Funada et al. ..................... 438/150 |
| 5,614,733 | 3/1997 | Zhang et al. ...................... 257/66 |
| 5,616,506 | 4/1997 | Takemura .......................... 438/150 |
| 5,619,044 | 4/1997 | Makita et al. . |
| 5,620,910 | 4/1997 | Teramoto ........................... 438/151 |
| 5,621,224 | 4/1997 | Yamazaki et al. ................. 257/66 |
| 5,624,851 | 4/1997 | Takayama et al. ................. 438/166 |
| 5,637,515 | 6/1997 | Takemura .......................... 438/162 |
| 5,639,698 | 6/1997 | Yamazaki et al. ................. 438/486 |
| 5,643,826 | 7/1997 | Ohtani et al. ..................... 438/162 |
| 5,646,424 | 7/1997 | Zhang et al. ...................... 257/66 |
| 5,654,203 | 8/1997 | Ohtani et al. ..................... 438/97 |
| 5,656,825 | 8/1997 | Kusumoto et al. ................ 257/66 |
| 5,661,311 | 8/1997 | Takemura et al. . |
| 5,663,077 | 9/1997 | Adachi et al. ..................... 438/151 |
| 5,677,549 | 10/1997 | Takayama et al. ................. 257/66 |
| 5,684,317 | 11/1997 | Hwang . |
| 5,684,365 | 11/1997 | Tang et al. . |
| 5,686,328 | 11/1997 | Zhang et al. . |
| 5,686,329 | 11/1997 | Zhang et al. . |
| 5,693,541 | 12/1997 | Yamazaki et al. . |
| 5,693,959 | 12/1997 | Inoue et al. . |
| 5,696,003 | 12/1997 | Makita et al. . |
| 5,696,386 | 12/1997 | Yamazaki .......................... 257/57 |
| 5,696,388 | 12/1997 | Funda et al. ...................... 257/64 |
| 5,700,333 | 12/1997 | Yamazaki et al. ................. 136/258 |
| 5,705,829 | 1/1998 | Miyanaga et al. ................. 257/66 |
| 5,712,191 | 1/1998 | Nakajima et al. ................. 438/487 |
| 5,717,224 | 2/1998 | Zhang . |
| 5,734,179 | 3/1998 | Chang et al. . |
| 5,744,822 | 4/1998 | Takayama et al. ................. 257/66 |
| 5,744,824 | 4/1998 | Kousai et al. ..................... 257/74 |
| 5,756,364 | 5/1998 | Tanaka et al. ..................... 438/30 |
| 5,763,899 | 6/1998 | Yamazaki et al. . |
| 5,766,977 | 6/1998 | Yamazaki .......................... 438/151 |
| 5,773,327 | 6/1998 | Yamazaki et al. ................. 438/154 |
| 5,773,846 | 6/1998 | Zhang et al. ...................... 257/66 |
| 5,773,847 | 6/1998 | Hayakawa ......................... 257/66 |
| 5,786,796 | 7/1998 | Takayama et al. . |
| 5,795,795 | 8/1998 | Kousai et al. ..................... 437/174 |
| 5,808,321 | 9/1998 | Mitanaga et al. .................. 257/72 |
| 5,811,327 | 9/1998 | Funai et al. ....................... 438/166 |
| 5,818,076 | 10/1998 | Zhang et al. ...................... 257/255 |
| 5,821,138 | 10/1998 | Yamazaki et al. ................. 438/166 |
| 5,821,560 | 10/1998 | Arai et al. . |
| 5,824,574 | 10/1998 | Yamazaki et al. ................. 438/150 |
| 5,828,429 | 10/1998 | Takemura . |
| 5,838,508 | 11/1998 | Sugawara . |
| 5,843,225 | 12/1998 | Takayama et al. . |
| 5,846,857 * | 12/1998 | Ju ...................................... 257/336 |
| 5,849,611 | 12/1998 | Yamazaki et al. . |
| 5,882,960 | 3/1999 | Zhang et al. . |
| 5,888,858 | 3/1999 | Yamazaki et al. . |
| 5,895,933 * | 12/1998 | Zhang et al. ...................... 257/49 |
| 5,899,547 | 5/1999 | Yamazaki et al. . |
| 5,929,464 | 7/1999 | Yamazaki et al. . |
| 5,933,205 | 8/1999 | Yamazaki et al. . |
| 5,940,732 * | 8/1999 | Zhang ................................ 438/640 |

| | | |
|---|---|---|
| 5,962,869 * | 10/1999 | Yamazaki et al. .................... 257/49 |
| 5,963,278 | 10/1999 | Yamazaki et al. . |
| 5,985,740 | 11/1999 | Yamazaki et al. . |
| 5,990,491 | 11/1999 | Zhang . |
| 5,990,542 | 11/1999 | Yamazaki . |
| 6,005,648 | 12/1999 | Zhang et al. . |
| 6,011,277 | 1/2000 | Yamazaki . |
| 6,013,929 | 1/2000 | Ohtani . |
| 6,048,758 | 4/2000 | Yamazaki et al. . |
| 6,063,654 | 5/2000 | Ohtani . |
| 6,077,731 | 6/2000 | Yamazaki et al. . |
| 6,093,934 | 7/2000 | Yamazaki et al. . |
| 6,100,562 | 8/2000 | Yamazaki et al. . |

FOREIGN PATENT DOCUMENTS

| | | |
|---|---|---|
| 1-878875 | 7/1989 | (JP) . |
| 1-206632 | 8/1989 | (JP) . |
| 64-81324 | 8/1989 | (JP) . |
| 2-140915 | 5/1990 | (JP) . |
| 2-148687 | 6/1990 | (JP) . |
| 2-275641 | 11/1990 | (JP) . |
| 3-280418 | 12/1991 | (JP) . |
| 3-280420 | 12/1991 | (JP) . |
| 5-082442 | 4/1993 | (JP) . |
| 5-107561 | 4/1993 | (JP) . |
| 5-299348 | 11/1993 | (JP) . |
| 52-99348 | 11/1993 | (JP) . |
| 6-232059 | 8/1994 | (JP) . |
| 7-161634 | 6/1995 | (JP) . |
| 7-321339 | 12/1995 | (JP) . |
| 8-129358 | 5/1996 | (JP) . |
| 8-129359 | 5/1996 | (JP) . |
| 8-129360 | 5/1996 | (JP) . |
| 8-234683 | 9/1996 | (JP) . |
| 8-241047 | 9/1996 | (JP) . |
| 8-241048 | 9/1996 | (JP) . |
| 8-241057 | 9/1996 | (JP) . |
| 8-241997 | 9/1996 | (JP) . |

OTHER PUBLICATIONS

Bruines et al., Applied Physics Letters, vol. 50, Mar. 1, 1987, pp. 507–509.
Stoemenos et al., Applied Physics Letters, vol. 58, Mar. 18, 1991, pp. 1196–1198.
Caune et al., Applied Surface Science, vol. 36, Jan. 1, 1989, pp. 597–604.
Spaepen et al., Crucial Issues in Semiconductor Materials and Processing Technologies, Jan. 1, 1992, pp. 483–499.
Green et al., IBM Technical Disclosure Bulletin, vol. 16, Oct. 1, 1973, pp. 1612–1613.
Hatalis et al., IEEE Electron Device Letters, vol. EDL-8, Aug. 1, 1987, pp. 361–364.
Kuzunetsov et al., Institute of Physics Conference, Apr. 5, 1993, pp. 191–194.
Kakkad et al., Japanese Journal of Applied Physics, vol. 65, Mar. 1, 1989, pp. 2069–2072.
Hayzelden et al., Japanese Journal of Applied Physics, Jun. 1993, pp. 8279–8289.
Oki et al., Japanese Journal of Applied Physics, Jan. 1, 1969, pp. 1056.
Kawazu et al., Japanese Journal of Applied Physics, vol. 29, Apr. 1, 1990, pp. 729–738.
Kawazu et al., Japanese Journal of Applied Physics , vol. 29, Dec. 1, 1990, pp. 2698–2704.
Takenaka et al., Japanese Journal of Applied Physics, vol. 29, Dec. 1, 1990, pp. L2380–2383.
Dvurenchenskii et al., Phys. Stat. Sol., Jan. 1, 1986, pp. 635–640.
Wolf et al., Silicon Processing for the VLSI ERA, vol. 1, Jan. 1, 1989, pp. 215–216.
Wolf et al., Silicon Processing for the VLSI ERA, vol. 1, Jan. 1, 1989, pp. 207–211.
Wolf et al., Silicon Processing for the VLSI ERA, vol. 1, Jan. 1, 1989, pp. 550–551.
Hempel et al., Solid State Communications, vol. 85, Mar. 1, 1993, pp. 921–924.
Batstone et al., Solid State Phenomena, vol. 37–38, Jan. 1, 1994, pp. 257–268.
Lau et al., Thin Solid Films, vol. 47, Jan. 1, 1997, pp. 313–322.
Suresh et al., Thin Solid Films, vol. 252, Jan. 1, 1994, pp. 78–81.
Ghandi et al., VLSI Fabrication Principles, Jan. 1, 1983, pp. 419–429.
Sakaguchi et al., IEICE Trans. Electron., vol. E80 C., No. 3, Mar. 1, 1997, pp. 378–387.
**Kuo et al., Thin Film Transistor Technologies, vol. 94–35, pp. 116–122.
Kouvatsos et al., Applied Physics Letters, vol. 61, No. 8, Aug. 24, 1992, pp. 937–939.
Kuper et al., Japanese Journal of Applied Physics, vol. 60, No. 3, Aug. 1, 1986, pp. 985–990.
Sze, VLSI Technology, Second Edition, Jan. 1, 1988.
Hayashi et al., IEDM 95, Jan, 1, 1995, pp. 829–832.
Wolf et al., Silicon Processing for the VLSI ERA, vol. 1, Jan. 1, 1986, pp. 198–207.
Cammarata et al., Journal of Materials Research, vol. 5, Dec. 1, 1990, pp. 2133–2138.
Kakkad et al., Journal of Crystalline Solids, vol. 115, Jan. 1, 1989, pp. 66–68.
Zorabedian et al., Materials Research Society Symposia Proceedings, vol. 33, Jan. 1, 1984, pp. 81–86.
Kuznetsov et al., Nuclear Instruments and Methods in Physics Research, Jan. 1, 1993, pp. 990–993.
R. J. Nemanich et al, "Structure and Growth of the Interface of Pd on –SiH", The American Physical Society—Physical Review, vol. 22, No. 12, pp. 6828–6831, Jun. 1981.
M.J. Thompson et al, "Silicide Formation in Pd––Si:H Schottky Barriers", Appl. Phys. Lett., vol. 39, No. 3, pp. 274–276, Aug. 1981.
R.J. Nemanich et al, "Initial Phase Formation at the Interface of Ni, Pd, or Pt and Si", Mat. Res. Soc. Symp. Proc., vol. 25, 1984.

* cited by examiner

FORMATION OF AMORPHOUS SILICON FILM

INTRODUCTION OF Ni ELEMENT

HEAT TREATMENT FOR CRYSTALLIZATION

HEAT TREATMENT WITHIN ATMOSPHERE CONTAINING CHLORINE

ELIMINATION OF OXIDE FILM CONTAINING Ni

HEAT TREATMENT FOR CRYSTALLIZATION

HEAT TREATMENT WITHIN ATMOSPHERE CONTAINING CHLORINE

DISPLAY SWITCH WITH DOUBLE LAYERED GATE INSULATION AND RESINOUS INTERLAYER DIELECTRIC

This application is a Division of application Ser. No. 08/783,866, filed Jan. 16, 1997. U.S. Pat. No. 5,985,740.

DETAILED DESCRIPTION OF THE INVENTION

1. Field of the Invention

The present invention relates to a semiconductor device typified by a thin film transistor and to a fabrication method thereof. Specifically, the present invention relates to a semiconductor device using a crystal silicon thin film formed on a glass substrate or a quartz substrate and to a fabrication method thereof.

2. Description of Related Art

Hitherto, there has been known a thin film transistor using a silicon film, i.e. a technology for forming the thin film transistor by using the silicon film formed on a glass substrate or quartz substrate.

The glass substrate or quartz substrate is used because the thin film transistor is used for an active matrix type liquid crystal display. While a thin film transistor has been formed by using an amorphous silicon film in the past; it is being tried to fabricate the thin film transistor by utilizing a silicon film having a crystalinity (referred to as "crystal silicon film" hereinbelow) in order to enhance its performance.

The thin film transistor using the crystal silicon film allows to operate at high speed by more than two digits as compared to one using the amorphous silicon film. Therefore, while peripheral driving circuits of an active matrix liquid crystal display have been composed of external IC circuits, they may be built on the glass substrate or quartz substrate similarly to the active matrix circuit.

Such structure is very advantageous in miniaturizing the whole apparatus and in simplifying the fabrication process, thus leading to the reduction of the fabrication cost.

In general, a crystal silicon film has been obtained by forming an amorphous silicon film by means of plasma CVD or reduced pressure thermal CVD and then by crystallizing it by implementing a heat treatment or by irradiating laser light.

However, it has been the fact that it is difficult to obtain a required crystalinity across the wide area through the heat treatment because it may cause nonuniformity in the crystallization.

Further, although it is possible to obtain the high crystalinity partly by irradiating laser light, it is difficult to obtain a good annealing effect across the wide area. In particular, the irradiation of the laser light is apt to become unstable under the condition for obtaining the good crystalinity.

Meanwhile, a technology described in Japanese Patent Laid-Open No. Hei. 6-232059 has been known. This is a technology which allows to obtain a crystal silicon film through a heat treatment at a lower temperature than that of the prior art by introducing a metal element (e.g. nickel) which promotes the crystallization of silicon to the amorphous silicon film.

According to studies conducted by the inventors et. al. it has been found that the crystal silicon film obtained by this method has crystalinity which is good for practical use across the wide area.

However, it has been also found that because the metal element is contained within the film and the amount thereof to be introduced has to be controlled very carefully, there is a problem in its reproducibility and stability (electrical stability of a device obtained).

Further, there is a problem that an elapsed change of the characteristics of a semiconductor device to be obtained is large or an OFF value, in case of a thin film transistor, is large, for example due to the influence of the remaining metal element.

That is, although the metal element which promotes the crystallization of silicon plays the useful role in obtaining the crystal silicon film, its existence becomes a minus factor which causes various problems after obtaining the crystal silicon film once.

PROBLEMS TO BE SOLVED BY THE INVENTION

It is an object of the invention disclosed in the present specification to provide a technology for reducing concentration of metal element within a crystal silicon film obtained by utilizing the metal element which promotes crystallization of silicon.

It is another object of the present invention to provide a technology which can enhance characteristics and reliability of a semiconductor device thus obtained.

MEANS FOR SOLVING THE PROBLEMS

One of the invention disclosed in the present specification is characterized in that it comprises steps of intentionally introducing metal element which promotes crystallization of silicon to an amorphous silicon film and crystallizing the amorphous silicon film by a first heat treatment to obtain a crystal silicon film; eliminating or reducing the metal element existing within the crystal silicon film by implementing a second heat treatment within an oxidizing atmosphere containing a halogen element; eliminating a thermal oxide film formed in the previous step; and forming another thermal oxide film on the surface of the domain from which the thermal oxide film has been eliminated by implementing another thermal oxidation.

An arrangement of another invention is characterized in that it comprises steps of intentionally introducing metal element which promotes crystallization of silicon to an amorphous silicon film and crystallizing the amorphous silicon film by a first heat treatment to obtain a crystal silicon film; eliminating or reducing the metal element existing within the crystal silicon film by implementing a second heat treatment within an oxidizing atmosphere containing a halogen element to form a thermal oxide film on the surface of the crystal silicon film and by causing the thermal oxide film to getter the metal element; eliminating the thermal oxide film formed in the previous step; and forming another thermal oxide film on the surface of the domain from which the thermal oxide film has been eliminated by implementing another thermal oxidation.

An arrangement of another invention is characterized in that it comprises steps of intentionally introducing a metal element which promotes crystallization of silicon to an amorphous silicon film and crystallizing the amorphous silicon film by a first heat treatment to obtain a crystal silicon film; eliminating or reducing the metal element existing within the crystal silicon film by implementing a second heat treatment within an oxidizing atmosphere containing a halogen element; eliminating a thermal oxide film formed in the previous step; forming an active layer of a thin film transistor by implementing patterning; and forming another thermal oxide film which composes at least a part of a gate insulating film on the surface of the active layer by means of thermal oxidation.

An arrangement of another invention is characterized in that it comprises steps of selectively introducing a metal element which promotes crystallization of silicon to an amorphous silicon film; growing crystal by a first heat treatment in a direction parallel to the film from the domain to which the metal element has been selectively introduced; forming a thermal oxide film on the surface of the domain where the crystal has been grown by implementing a second heat treatment within an oxidizing atmosphere containing a halogen element; eliminating the thermal oxide film; and forming an active layer of the semiconductor device by using the domain from which the thermal oxide film has been eliminated.

In the invention disclosed in the present specification, one or a plurality elements selected from Fe, Co, Ni, Ru, Rh, Pd, Os, Ir, Pt, Cu and Au may be used as the metal element which promotes the crystallization of silicon.

Further, as the oxidizing atmosphere containing the halogen element, an atmosphere to which one or a plurality of gases selected from HCl, HF, HBr, $Cl_2$, $F_2$ or $Br_2$ is added into the $O_2$ atmosphere or an atmosphere containing $O_2$ may be used.

An arrangement of another invention is characterized in that a semiconductor device has a crystal silicon film interposed between a first and second oxide films; the crystal silicon film contains hydrogen and a halogen element as well as a metal element which promotes crystallization of silicon; and the metal element is distributed in high concentration near the interfaces with the first/second oxide film within the crystal silicon film.

The above-mentioned arrangement is characterized in that the halogen element is distributed in high concentration within the first oxide film or near the interface between the first oxide film and the crystal silicon film.

Further, the above-mentioned arrangement is characterized in that the halogen element is distributed in high concentration within the crystal silicon film near the interface with the second oxide film.

The above-mentioned arrangement is also characterized in that the first oxide film is a silicon oxide film or a silicon oxide nitride film formed on a glass substrate or a quartz substrate, the crystal silicon film constitutes an active layer of a thin film transistor and the second oxide film is a silicon oxide film or a silicon oxide nitride film constituting a gate insulating film.

An arrangement of another invention is characterized in that a semiconductor device comprises an underlying layer made of an oxide film; a crystal silicon film formed on the underlying layer; and a thermal oxide film formed on the crystal silicon film; wherein the crystal silicon film contains a metal element which promotes crystallization of silicon, hydrogen and a halogen element; the metal element which promotes the crystallization of silicon is distributed in high concentration near the interface with the underlying layer/ the thermal oxide film; the halogen element is distributed in high concentration near the interface with the underlying layer/the thermal oxide film; and the thermal oxide film composes at least part of a gate insulating film of a thin film transistor.

The concentration of impurity in the present specification is defined as the minimum value of measured values measured by the SIMS (secondary ion mass spectrometry).

MODE FOR CARRYING OUT THE INVENTION

According to a preferred mode for carrying out the invention disclosed in the present specification, an amorphous silicon film is formed at first. Then, the amorphous silicon film is crystallized by an action of metal element typified by nickel which promotes crystallization of silicon to obtain a crystal silicon film. The crystallization is carried out by heat treatment.

The metal element is contained in the crystal silicon film in this state. Then, another heat treatment is implemented within an oxidizing atmosphere to which HCl is added to form a thermal oxide film on the surface of the crystal silicon film.

At this time, the metal element is gettered to the thermal oxide film by the action of chlorine and the concentration of the metal element within the crystal silicon film drops. Further, the nickel element is gasified and removed to the outside by the action of chlorine.

Then, the crystal silicon film having the high crystalinity, and having low concentration of the metal element may be obtained by eliminating the thermal oxide film to which the element has been gettered.

DESCRIPTION OF PREFERRED EMBODIMENTS

First Embodiment

An arrangement for obtaining a crystal silicon film on a glass substrate by utilizing nickel element will be explained in the present embodiment.

At first, the crystal silicon film having a high crystalinity is obtained by an action of nickel element in. the present embodiment.

Next, a thermal oxide film containing halogen element is formed on the crystal silicon film by thermal oxidation. At this time, the nickel element remaining in the crystal silicon film thus obtained is gettered to the thermal oxide film by the action of the halogen element.

Then, the thermal oxide film containing the nickel element in high concentration as a result of the gettering is eliminated. Thereby, the crystal silicon film having nickel element in low concentration while having the high crystalinity is obtained on the glass substrate.

A fabrication process of the present embodiment will be explained by using FIG. 1 below. At first, a silicon oxide nitride film 102 is formed as an underlying film in a thickness of 3000 angstrom on the glass substrate 101 of Coning 1737 (distortion point: 667° C.).

The silicon oxide nitride film is formed by using plasma CVD using sillane, $N_2O$ gas and oxygen as original gases. Or, it may be formed by using plasma CVD using TEOS gas and $N_2O$ gas.

The silicon oxide nitride film has a function of suppressing the diffusion of impurities from the glass substrate in. the later steps (seeing from the level of fabrication of a semiconductor, a glass substrate contains a large amount of impurities).

It is noted that although the silicon nitride film is most suitable to maximize the function of suppressing the diffusion of the impurities, the silicon nitride film is not practical because it is peeled off from the glass substrate due to the influence of stress. A silicon oxide film may be also used as the underlying film instead of the silicon oxide nitride film.

It is also important to increase the hardness of the underlying film 102 as much as possible. It is concluded from the fact that the harder the hardness of the underlying film (i.e. the smaller the etching rate thereof), the higher the reliability is in an endurance test of the thin film transistor obtained in the end. It is assumed to be caused by the effect of blocking the impurities from the glass substrate in the fabrication process of the thin film transistor.

It is also effective to include a small amount of halogen element typified by chlorine in the underlying film 102. Thereby, the metal element which promotes crystallization of silicon and which exists within the semiconductor layer may be gettered by the halogen element in the later step.

It is also effective to add a hydrogen plasma treatment after forming the underlying film. It is also effective to implement a plasma treatment in an atmosphere in which oxygen and hydrogen are mixed. These treatments are effective in eliminating carbon component which is adsorbed on the surface of the underlying film and in enhancing the characteristic of interface with a semiconductor film formed later.

Next, an amorphous silicon film 103, which turns out to be a crystal silicon film later, is formed in a thickness of 500 angstrom by the reduced pressure thermal CVD. The reason why the reduced pressure thermal CVD is used is because thereby, the quality of the crystal silicon film obtained later is better, i.e. the film quality is denser in concrete. Beside the reduced pressure thermal CVD, the plasma CVD may be used.

The amorphous silicon film fabricated here is desirable to have $5 \times 10^{17}$ cm$^{-3}$ to $2 \times 10^{19}$ cm$^{-3}$ of concentration of oxygen within the film. It is because oxygen plays an important role in the later step of gettering the metal element which promotes crystallization of silicon.

However, it must be careful here because the crystallization of the amorphous silicon film is hampered if the oxygen concentration is higher than the above-mentioned range of concentration.

The concentration of other impurities such as those of nitrogen and carbon is preferred to be low to the utmost. In concrete, the concentration must be below $2 \times 10^{19}$ cm$^{-3}$.

The thickness of the amorphous silicon film 103 is 1600 angstrom. The thickness of the amorphous silicon film must be thicker than a thickness required in the end as described later.

When the amorphous silicon film 103 is crystallized by means of only heating, the thickness of the starting film (amorphous silicon film) 103 is set at 800 angstrom to 5000 $\mu$m or preferably, 1500 to 3000 angstrom. It is uneconomical from the aspect of production cost if the thickness is thicker than the above-mentioned thickness range because it takes more time in forming the film. When the thickness is thinner than the above-mentioned thickness range on the other hand, the crystal may be grown non-uniformly or the reproducibility of the process may become bad.

Thus, the state shown in FIGS. 1A–1E is obtained.

Next, nickel element is introduced to the amorphous silicon film 103 to crystallize it. Here, the nickel element is introduced by applying nickel acetate solution containing 10 ppm (reduced to weight) of nickel on the surface of the amorphous silicon film 103.

Beside the method of using the above-mentioned solution, sputtering, CVD, plasma treatment or adsorption may be used as the method for introducing the nickel element.

The method of using the solution is useful in that it is simple and that the concentration of the metal element may be readily adjusted.

The nickel acetate solution is applied as described above to form a water film (liquid film) 104 as shown in FIG. 1B. In this state, extra solution is blown out by using a spin coater not shown. Thus, the nickel element is held in contact on the surface of the amorphous silicon film 103.

It is noted that it is preferable to use nickel sulfate solution for example, instead of using the nickel acetate, if the remained impurities in the later heating process is taken into consideration. It is because the nickel acetate contains carbon and it might be carbonized in the later heating process, thus remaining within the film.

An amount of the nickel element to be introduced may be controlled by adjusting the concentration of nickel element within the solution.

Next, a heat treatment is implemented in the temperature range from 450° C. to 650° C. in the state shown in FIG. 1C to crystallize the amorphous silicon film 103 and to obtain a crystal silicon film 105. This heat treatment is implemented in a reducing atmosphere.

Here, the heat treatment is implemented for four hours at 620° C. within a nitrogen atmosphere containing 3% of hydrogen.

The reason why the reducing atmosphere is adopted in the crystallization step in a way of the heat treatment is to prevent oxides from being created in the step of the heat treatment and more concretely, to suppress nickel from reacting with oxygen and NiOx from being created on the surface of the film or within the film.

Oxygen couples with nickel and contributes a lot in gettering nickel in the later gettering step. However, it has been found that if oxygen couples with nickel in the above-mentioned stage of the crystallization, it hampers the crystallization. Accordingly, it is important to suppress the oxides from being created to the utmost in the crystallization step in a way of heating.

The concentration of oxygen within the atmosphere for implementing the heat treatment for the crystallization has to be in an order of ppm, or preferably, less than 1 ppm.

Inert gases such as argon, beside nitrogen, or their mixed gas may be used as the gas which occupies the most of the atmosphere for implementing the heat treatment for the. crystallization.

The lower limit of the heating temperature for the crystallization is preferred to be 450° C. or more from the aspects of its effectiveness and reproducibility. On the other hand, the upper limit thereof is preferred to be less than the distortion point of the used glass substrate. Because the Coning 1737 glass substrate whose distortion point is 667° C. is used here, its upper limit is set at 650° C., leaving some margin.

In this regard, the heating temperature may be increased up to around 900° C. if a quartz substrate is used as the substrate. In this case, a crystal silicon film having a higher crystalinity may be obtained in a shorter time.

Thus, the crystal silicon film 105 is obtained as shown in FIG. 1C.

Another heat treatment is implemented after obtaining the crystal silicon film 105 to form a thermal oxide film containing halogen element. Then, this heat treatment is implemented within an atmosphere containing halogen element (FIG. 1D).

This step is carried out to eliminate the nickel element which has been introduced intentionally for the crystallization in the initial stage from the crystal silicon film 105. This heat treatment is implemented at a temperature higher than that of the heat treatment implemented for the crystallization described above. It is an important condition for effectively implementing the gettering of nickel element.

This heat treatment is implemented in the temperature range from 550° C. to 1050° C. or preferably from 600° C. to 980° C. upon meeting the above-mentioned condition.

It is because no effect is obtained if the temperature is below 600° C., and a fixture formed by quartz distorts or a burden is placed upon equipments if it exceeds 1050° C. (in this sense, it is preferable to be less than 980° C.

Further, the upper limit of the heating temperature is limited by the distortion point of the glass substrate to be used. It must be careful not to implement the heat treatment in a temperature above the distortion point of the glass substrate to be used because, otherwise, it is deformed.

Because the Coning 1737 glass substrate whose distortion point is 667° C. is used here, the heating temperature is set at 650° C. The second heat treatment is implemented in an atmosphere in which 5 volume % of HCl is included in oxygen.

It is preferable to mix HCl with a ratio of 0.5% to 10% (volume %) to oxygen. It must be careful not to mix above this concentration because, otherwise, the surface of the film becomes rough with the same or more degree of irregularity with the thickness of the film.

A thermal oxide film 106 containing chlorine as shown in FIG. 1D is formed by implementing the heat treatment under such condition. Here, the thermal oxide film 106 is formed in a thickness of 200 angstrom by implementing the heat treatment for 12 hours.

Because the thermal oxide film 106 is formed, the thickness of the crystal silicon film 106 reaches to about 1500 angstrom.

When the heating temperature is 600° C. to 750° C. in this heat treatment, the treatment time (heating time) is set at 10 hours to 48 hours or typically at 24 hours.

It is noted that if the heating temperature is 750° C. to 900° C., the treatment time is set at 5 hours to 24 hours or typically at 12 hours.

Further, when the heating temperature is 900° C. to 1050° C., the treatment time is set at 1 hour to 12 hours or typically at 6 hours.

These treatment times are set adequately depending on the thickness of the oxide film to be obtained as a matter of course.

In this step, nickel element is gettered out of the silicon film by the action of the halogen element. Here, the nickel element is gettered to the thermal oxide film 106 thus formed by the action of chlorine.

In the gettering, oxygen existing within the crystal silicon film plays an important role. That is, the gettering of nickel element proceeds effectively because the gettering effect caused by chlorine acts on nickel oxide formed when oxygen couples with nickel.

If the concentration of oxygen is too much, it becomes the factor of hampering the crystallization of the amorphous silicon film 103 in the crystallization step shown in FIG. 1C as described above. However, the existence thereof plays an important role in the process of gettering nickel as described above. Accordingly, it is important to control the concentration of oxygen existing within the amorphous silicon film, the starting film.

Here, Cl has been selected as the halogen element and the case of using HCl has been shown as a method for introducing it. Beside HCl, one type or a plurality of types of mixed gas selected from HF, HBr, $Cl_2$, $F_2$, $Br_2$ may be used. Beside them, halogen hydroxide may be used in general.

It is preferable to set the content (volume content) of those gases within the atmosphere to 0.25 to 5% if it is RF, 1 to 15% if it is HBr, 0.25 to 5% if it is $Cl_2$, 0.125 to 2.5% if it is $F_2$ and 0.5 to 10% if it is $Br_2$.

If the concentration is below the above-mentioned range, no significant effect is obtained. Further, if the concentration exceeds the upper limit of the above-mentioned range, the surface of the crystal silicon film is roughened.

Through this step, the concentration of nickel element may be reduced to less than 1/10 in maximum from the initial stage. It means that the nickel element may be reduced to 1/10 as compared to the case when no gettering is conducted by the halogen element. This effect may be obtained in the same manner even when another metal element is used.

Because the nickel element is gettered to the oxide film to be formed in the above-mentioned step, naturally the nickel concentration within the oxide film becomes high as compared to other domains.

Further, it has been observed that the concentration of nickel element is apt to be high near the interface of the crystal silicon film 105 with the oxide film 106. It is considered to happen because the domain where the gettering mainly takes place is on the side of the oxide film near the interface between the silicon film and the oxide film. The gettering proceeding near the interface is considered to be caused by the existence of stress and defects near the interface.

Then, the thermal oxide film 106 containing nickel in high concentration. is eliminated. The thermal oxide film 106 may be eliminated by means of wet etching or dry etching using buffer hydrofluoric acid (or other hydrofluorite etchant).

Thus, a crystal silicon film 107 in which the concentration of nickel has been reduced is obtained as shown in FIG. 1E.

Because nickel element is contained near the surface of the obtained crystal silicon film 107 relatively in high concentration, it is effective to advance the above-mentioned etching to over-etch, more or less, the surface of the crystal silicon film 107.

Second Embodiment

The present embodiment relates to a case when laser light is irradiated after obtaining the crystal silicon film by the heat treatment shown in FIG. 1B in the arrangement shown in the first embodiment to promote the crystallization thereof.

When the temperature of the heat treatment shown in FIG. 1B is low or when the treatment time is short, i.e. when the heating temperature or the heating time is restricted by the reason of the fabrication process, there is a possibility that the required crystalinity cannot not be obtained. In such a case, the required high crystalinity may be obtained by implementing annealing by irradiating laser light.

The width of the permissible laser irradiation condition of the irradiation of laser this time is wide as compared to the case when the amorphous silicon film is directly crystallized. Further, its high reproduciblity may be enhanced.

The irradiation of laser light is implemented after the step shown in FIG. 1C. It is also important to form the amorphous silicon film 103 which is formed in FIG. 1A as the starting film in a thickness of 200 to 2000 angstrom. It is because the annealing effect exerted by the irradiation of laser light becomes high when the thickness of the amorphous silicon film is thin.

It is preferable to use excimer laser in the ultraviolet region as the laser light to be used. In concrete, KrF excimer laser (wavelength: 248 nm), XeCl excimer laser (wavelength: 308 nm) and the like may be used. Beside laser light, the annealing may be implemented by irradiating intense light by using an ultraviolet lamp.

Third Embodiment

The present embodiment relates to a case when an infrared lamp is used instead of the laser light in the second embodiment. The use of infrared ray allows the silicon film to be heated selectively without heating the glass substrate so much. Accordingly, an effective heat treatment may be implemented without giving thermal damage to the glass substrate.

Fourth Embodiment

The present embodiment relates to a case when Cu is used as the metal element which promotes the crystallization of silicon in the arrangement shown in the first embodiment. In this case, cupric acetate [$Cu(CH_3COO)_2$] or cupricchloride ($CuCl_2 2H_2O$) may be used as the solution for introducing Cu.

Fifth Embodiment

The present embodiment relates to a case when a quartz substrate is used as the substrate 101 in the arrangement shown in the first embodiment. In the present embodiment, the amorphous silicon film 103, i.e. the starting film, is formed in a thickness of 2000 angstrom. Further, the heating temperature in forming the thermal oxide film in the heat treatment shown in FIG. 1C is set at 950° C.

In this case, the oxide film is formed quickly and the gettering effect cannot be fully obtained, so that the concentration of oxygen within the atmosphere is lowered. In concrete, the oxygen concentration within the nitrogen atmosphere is set at 10%. Further, the heat treatment is implemented in the atmosphere in which the concentration of HCl (volume concentration) to oxygen is set at 3%.

In this case, the treatment time is set at 300 minutes. Under such conditions, the thermal oxide film having about 500 angstrom of thickness may be obtained. In the same time, the time necessary for gettering may be earned.

It is noted that if the heat treatment is implemented at 950° C. within the atmosphere of 97% of oxygen and 3% of HCl, a thermal oxide film having a thickness of 500 angstrom is obtained in about 30 minutes. In this case, nickel cannot be fully gettered, so that nickel element remains relatively in high concentration within the crystal silicon film 107.

Accordingly, it is preferable to form the thermal oxide film by adjusting the oxygen concentration as described in the present embodiment to earn an enough time to obtain the gettering effect.

The utilization of this method allows the time necessary for the gettering to be set by adjusting the oxygen concentration in the atmosphere when the thickness and forming temperature of the thermal oxide film are changed.

Sixth Embodiment

The present embodiment relates to a case of growing crystal in the form different from that in the first embodiment. That is, the present embodiment relates to a method of growing the crystal in a direction parallel to the substrate, i.e. a method called lateral growth, by utilizing the metal element which promotes crystallization of silicon.

FIG. 2 shows the fabrication process according to the present embodiment. At first, a silicon oxide nitride film is formed as an underlying film 202 in a thickness of 3000 angstrom on the Coning 1737 glass substrate (or a quartz substrate) 201.

Next, an amorphous silicon film 203 which is the starting film of a crystal silicon film is formed in a thickness of 2000 angstrom by reduced pressure thermal CVD. The thickness of the amorphous silicon film is preferable to be less than 2000 angstrom as described before.

It is noted that plasma CVD may be used instead of the reduced pressure thermal CVD.

Next, a silicon oxide film not shown is formed in a thickness of 1500 angstrom and is patterned to form a mask 204. An opening is created on the mask in a domain 205. The amorphous silicon film 203 is exposed at the domain where the opening 205 is created.

The opening 205 has a thin and long rectangular shape in the longitudinal direction from the depth to the front side of the figure. Preferably, the width of the opening 203 is 20 $\mu$m or more. The length thereof in the longitudinal direction may be determined arbitrarily.

Then, the nickel acetate aqueous solution containing 10 ppm of nickel element in terms of weight is applied in the same manner with the first embodiment and the extra solution is removed by implementing spin drying by using a spinner not shown.

Thus, the solution is held in contact on the exposed surface of the amorphous silicon film 203 as indicated by a dot line 206 in FIG. 2A.

Next, a heat treatment is implemented at 640° C. for four hours in a nitrogen atmosphere containing 3% of hydrogen and in which oxygen is minimized. Then, crystal grows in the direction parallel to the substrate as indicated by the reference numeral 207 in FIG. 2B. This crystal growth advances from the domain of the opening 205 to which nickel element has been introduced to the surrounding part. This crystal growth in the direction parallel to the substrate will be referred to as lateral growth.

It is possible to advance this lateral growth across more than 100 $\mu$m under the conditions shown in the present embodiment. Then, a crystal silicon film 208 having the domain in which the crystal has thus grown laterally is obtained. It is noted that crystal growth in the vertical direction called vertical growth advances from the surface of the silicon film to the underlying interface in the domain where the opening 205 is formed.

Then, the mask 204 made of the silicon oxide film for selectively introducing nickel element is eliminated. Thus, the state shown in FIG. 2C is obtained. In this state, the vertically grown domain, the laterally grown domain and a domain in which no crystal has grown (having amorphous state) exist within the silicon film 208.

In this state, a heat treatment is implemented at 650° C. for 12 hours within an oxygen atmosphere containing 3% of HCl. In this step, an oxide film 209 containing nickel element in high concentration is formed. In the same time, the concentration of nickel element within the silicon film 208 may be reduced relatively.

Here, the thermal oxide film 209 is formed in a thickness of 200 angstrom. The thermal oxide film contains the nickel element gettered by the action of chlorine in high concentration. Further, because the thermal oxide film 209 is formed, the thickness of the crystal silicon film 208 is reduced to about 1900 angstrom.

Next, the thermal oxide film 209 containing nickel element in high concentration is eliminated.

In the crystal silicon film of this state, the nickel element has a distribution of concentration such that it exists in high concentration toward the surface of the crystal silicon film.

Accordingly, it is useful to etch the surface of the crystal silicon film to eliminate the domain in which the nickel element exists in high concentration after eliminating the thermal oxide film 209. That is, the crystal silicon film in which the nickel element concentration is reduced further may be obtained by etching the surface of the crystal silicon film in which the nickel element exists in high concentration.

Next, patterning is implemented to form a pattern 210 formed of the laterally grown domain. Here, it is important to form the pattern 210 such that no vertically grown domain, amorphous domain nor an edge portion of the laterally grown domain is included there.

It is because the concentration of nickel element is relatively high in the edge portion of the vertically and laterally grown domains and the amorphous domain has inferior electrical characteristics.

The concentration of nickel element which remains within the pattern 210 made of the laterally grown domain thus obtained may be reduced further as compared to the case shown in the first embodiment.

This is caused by the fact that the concentration of the metal element contained within the laterally grown domain is low originally. In concrete, the concentration of nickel element within the pattern 209 made of the laterally grown domain may be readily reduced to the order of $10^{17}$ cm$^{-3}$ or less.

When a thin film transistor is formed by utilizing the laterally grown domain, a semiconductor device having a higher mobility may be obtained as compared to the case when the vertically grown domain as shown in the first embodiment (crystal grows vertically on the whole surface in the case of the first embodiment) is utilized.

It is noted that it is useful to implement the etching process further after forming the pattern shown in FIG. 2E to eliminate the nickel element existing on the surface of the pattern.

However, it is not useful to implement thermal oxidation within the oxidizing atmosphere containing halogen element after patterning the crystal silicon film in a shape of island and then to eliminate the thermal oxide film.

It is because in this arrangement, the etching advances so as to scoop out even the under side of the crystal silicon film formed in an island shape because the etching of the underlying film advances when the thermal oxide film is eliminated, though the gettering effect is certainly obtained by the thermal oxide film. Such condition may cause breaking of wires and defective operation of elements later.

Then, a thermal oxide film 210 is formed after thus forming the pattern 210. This thermal oxide film becomes a part of a gate insulating film later when a thin film transistor is constructed.

Seventh Embodiment

The present embodiment relates to a case of fabricating a thin film transistor disposed in a pixel domain of an active matrix type liquid crystal display or an active matrix type EL display by utilizing the invention disclosed in the present specification.

FIG. 3 shows the fabrication process according to the present embodiment. At first, the crystal silicon film is formed on the glass substrate through the process shown in the first or the sixth embodiment. When the crystal silicon film is obtained by the arrangement shown in the first embodiment, it is patterned to obtain the state shown in FIG. 3A.

In FIG. 3A, the reference numeral 301 denotes a glass substrate, 302 an underlying film, and 303 an active layer formed of the crystal silicon film. After obtaining the state shown in FIG. 3A, a plasma treatment is implemented within a reduced pressure atmosphere in which oxygen and hydrogen are mixed. The plasma is generated by high-frequency discharge.

Organic substances existing on the surface of the exposed active layer 105 may be removed by the above-mentioned plasma treatment. Specifically, the organic substances adsorbing on the surface of the active layer are oxidized by oxygen plasma and the oxidized organic substances are reduced and vaporized further by hydrogen plasma. Thus the organic substances existing on the surface of the exposed active layer 303 are removed.

The removal of the organic substances is very effective in suppressing fixed charge from existing on the surface of the active layer 303. Because the fixed charge caused by the existence of organic substances hampers the operation of the device and renders the characteristics thereof instable, it is very useful to reduce it.

After removing the organic substances, thermal oxidation is implemented within an oxygen atmosphere at 640° C. to form a thermal oxide film 300 of 100 angstrom thick. This thermal oxide film has a high interfacial characteristic with a semiconductor layer and composes a part of a gate insulating film later. Thus, the state shown in FIG. 3A is obtained.

After obtaining the state shown in FIG. 3A, a silicon oxide nitride film 304 which composes the gate insulating film is formed in a thickness of 1000 angstrom. The film may be formed by using plasma CVD using mixed gas of sillane and $N_2O$ or plasma CVD using mixed gas of TEOS and $N_2O$.

The silicon oxide nitride film 304 functions as the gate insulating film. together with the thermal oxide film 300.

It is also effective to contain halogen element within the silicon oxide nitride film. That is, it is possible to prevent the function of the gate insulating film as an insulating film from dropping by the influence of the nickel element (or another metal element which promotes crystallization of silicon) existing within the active layer by fixing the nickel element by the action of the halogen element.

It is significant to use the silicon oxide nitride film in that metal element hardly infiltrates to the gate insulating film from its dense film quality. If metal element infiltrates into the gate insulating film, its function as an insulating film drops, thus causing instability and dispersion of characteristics of the thin film transistor.

It is noted that a silicon oxide film which is normally used may be also used for the gate insulating film.

After forming the silicon oxide nitride film 304 which functions as the gate insulating film, an aluminum film not shown which functions as a gate electrode later is formed by sputtering. 0.2 weight % of scandium is included within the aluminum film.

Scandium is included in the aluminum film to suppress hillock and whisker from being produced in the later process. The hillock and whisker mean that abnormal growth of aluminum occurs by heating, thus forming needle or prickle-like projections.

After forming the aluminum film, a dense anodic oxide film not shown is formed. The anodic oxide film is formed by using ethylene glycol solution containing 3 weight % of tartaric acid as electrolyte. That is, the anodic oxide film having the dense film quality is formed on the surface of the aluminum film by setting the aluminum film as the anode and platinum as the cathode and by anodizing within this electrolyte.

The thickness of the anodic oxide film not shown having the dense film quality is around 100 angstrom. This anodic oxide film plays a role of enhancing the adhesiveness with a resist mask to be formed later.

It is noted that the thickness of the anodic oxide film may be controlled by adjusting voltage applied during the anodization.

Next, the resist mask 306 is formed and the aluminum film is patterned so as to have a pattern 305. The state shown in FIG. 3B is thus obtained.

Here, another anodization is implemented. In this case, 3 weight % of oxalate aqueous solution is used as electrolyte. A porous anodic oxide film 308 is formed by anodizing within this electrolyte by setting the aluminum pattern 305 as the anode.

In this step, the anodic oxide film 308 is formed selectively on the sides of the aluminum pattern because the resist mask 306 having the high adhesiveness exists thereabove.

The anodic oxide film may be grown up to several $\mu$m thick. The thickness is 6000 angstrom here. It is noted that the range of the growth may be controlled by adjusting an anodizing time.

Next, the resist mask 306 is removed. Then, a dense anodic oxide film is formed again. That is, the anodization is implemented again by using the ethylene glycol solution containing 3% of tartaric acid as electrolyte. Then, an anodic oxide film 309 having a dense film quality is formed because the electrolyte infiltrates into the porous anodic oxide film 308.

This dense anodic oxide film 309 is 1000 angstrom thick. The thickness is controlled by adjusting applied voltage.

Here, the exposed silicon oxide nitride film 304 and the thermal oxide film 300 are etched by utilizing dry etching. Then, the porous anodic oxide film 308 is eliminated by using mixed acid in which acetic acid, nitric acid and phosphoric acid are mixed. Thus, the state shown in FIG. 3D is obtained.

After obtaining the state shown in FIG. 3D, impurity ions are injected. Here, P (phosphorus) ions are injected by plasma doping in order to fabricate an N-channel type thin film transistor.

In this step, heavily doped domains 311 and 315 and lightly doped domains 312 and 314 are formed because part of the remaining silicon oxide film 310 functions as a semi-permeable mask, thus blocking part of the injected ions.

Then, laser light or intense light is irradiated to activate the domains into which the impurity ions have been injected. Thus, a source domain 311, a channel forming domain 313, a drain domain 315 and low concentrate impurity domains 312 and 314 are formed in a manner of self-adjustment.

The one designated by the reference numeral 314 here is the domain called the LDD (lightly doped domain) (FIG. 3D).

It is noted that when the dense anodic oxide film 309 is formed as thick as 2000 angstrom or more, an offset gate domain may be formed on the outside of the channel forming domain 313 by its thickness.

Although the offset gate domain is formed also in the present embodiment, it is not shown in the figures because its size is small, its contribution due to the existence thereof is small and the figures might otherwise become complicated.

Next, a silicon oxide film or a silicon nitride film or their laminated film is formed as an interlayer insulating film 316. The interlayer insulating film may be constructed by forming a layer made of a resin material on the silicon oxide film or the silicon nitride film.

Then, contact holes are created to form a source electrode 317 and a drain electrode 318. Thus, the thin film transistor shown in FIG. 3E is completed.

Eighth Embodiment

The present embodiment is related to a method for forming the gate insulating film 304 in the arrangement shown in the seventh embodiment. Thermal oxidation may be used as a method for forming the gate insulating film when a quartz substrate or a glass substrate having a high heat resistance is used as the substrate.

The thermal oxidation allows the film quality to be densified and is useful in obtaining a thin film transistor having stable characteristics.

That is, because an oxide film formed by the thermal oxidation is dense as an insulating film and movable electric charge existing therein can be reduced, it is one of the most suitable films as a gate insulating film.

A heat treatment is implemented for example in an oxidizing atmosphere at 950° C. in forming the thermal oxide film.

At this time, it is effective to mix HCl or the like into the oxidizing atmosphere because, thereby, metal element existing in the active layer may be fixed in the same time with the formation of the thermal oxide film.

It is also effective to mix $N_2O$ gas into the oxidizing atmosphere to form a thermal oxide film containing nitrogen component. Here, it is also possible to obtain a silicon oxide nitride film by the thermal oxidation if the mixed ratio of $N_2O$ gas is optimized.

It is noted that the thermal oxide film 300 needs not be formed in the present embodiment.

Eighth Embodiment

The present embodiment relates to a case of fabricating a thin film transistor through a process different from that shown in FIG. 3.

FIG. 4 shows the fabrication process according to the present embodiment. At first, the crystal silicon film is formed on the glass substrate through the process shown in the first or second embodiment. It is then patterned, thus obtaining the state shown in FIG. 4A.

After obtaining the state shown in FIG. 4A, a plasma treatment is implemented within a reduced pressure atmosphere in which oxygen and hydrogen are mixed.

In the state shown in FIG. 4A, the reference numeral 401 denotes a glass substrate, 402 an underlying film, 403 an active layer formed of the crystal silicon film and 400 a thermal oxide film formed again after eliminating the thermal oxide film for gettering.

After obtaining the state shown in FIG. 4A, a silicon oxide nitride film 404 which composes a gate insulating film is formed in a thickness of 1000 angstrom. The film may be formed by using plasma CVD using mixed gas of oxygen, sillane and $N_2O$ or plasma CVD using mixed gas of TEOS and $N_2O$.

The silicon oxide nitride film 404 composes the gate insulating film together with the thermal oxide film 400. It is noted that a silicon oxide film may be used beside the silicon oxide nitride film.

After forming the silicon oxide nitride film 404 which functions as the gate insulating film, an aluminum film not shown which functions as a gate electrode later is formed by sputtering. 0.2 weight % of scandium is included within the aluminum film.

After forming the aluminum film, a dense anodic oxide film not shown is formed. The anodic oxide film is formed by using ethylene glycol solution containing 3% of tartaric acid as electrolyte. That is, the anodic oxide film having the dense film quality is formed on the surface of the aluminum film by setting the aluminum film as the anode and platinum as the cathode and by anodizing within this electrolyte.

The thickness of the anodic oxide film not shown having the dense film quality is around 100 angstrom. This anodic oxide film plays a role of enhancing the adhesiveness with a resist mask to be formed later.

It is noted that the thickness of the anodic oxide film may be controlled by adjusting voltage applied during the anodization.

Next, the resist mask 405 is formed and the aluminum film is patterned so as to have a pattern 406.

Here, another anodization is implemented. In this case, 3% of oxalate aqueous solution is used as electrolyte. A porous anodic oxide film 407 is formed by anodizing within this electrolyte by setting the aluminum pattern 406 as the anode.

In this step, the anodic oxide film 407 is formed selectively on the sides of the aluminum pattern because the resist mask 405 having the high adhesiveness exists thereabove.

The anodic oxide film may be grown up to several μm thick. The thickness is 6000 angstrom here. It is noted that the range of the growth may be controlled by adjusting an anodizing time.

Then, after removing the resist mask 405, another dense anodic oxide film is formed. That is, the anodization is implemented again by using the ethylene glycol solution containing 3% of tartaric acid as electrolyte. Then, an anodic oxide film 408 having a dense film quality is formed because the electrolyte infiltrates into the porous anodic oxide film 407.

Here, the initial injection of impurity ions is implemented. It is noted that this step may be implemented after removing the resist mask 405.

A source domain 409 and a drain domain 411 are formed by injecting the impurity ions. No impurity ion is injected to a domain 410.

Then, the porous anodic oxide film 307 is eliminated by using mixed acid in which acetic acid, nitric acid and phosphoric acid are mixed. Thus, the state shown in FIG. 4D is obtained.

After obtaining the state shown in FIG. 4D, impurity ions are injected again. The impurity ions are injected under the doping condition lighter than that of the first injection.

In this step, lightly doped domains 412 and 413 are formed and a domain 414 turns out to be a channel forming domain (FIG. 4D).

Then, laser light or intense light is irradiated to activate the domains into which the impurity ions have been injected. Thus, the source domain 409, the channel forming domain 414, the drain domain 411 and low concentrate impurity domains 412 and 413 are formed in a manner of self-adjustment.

Here, the one designated by the reference numeral 413 is the domain called the LDD (lightly doped domain) (FIG. 4D).

Next, a silicon oxide film or a silicon nitride film or their laminated film is formed as an interlayer insulating film 414. The interlayer insulating film may be constructed by forming a layer made from a resin material on the silicon oxide film or the silicon nitride film.

After that, contact holes are created to form a source electrode 416 and a drain electrode 417. Thus, the thin film transistor shown in FIG. 4E is completed.

Ninth Embodiment

The present embodiment relates to a case when an N-channel type thin film transistor and a P-channel type thin film transistor are formed in a complementary manner.

The arrangement shown in the present embodiment may be utilized for various thin film integrated circuits integrated on an insulated surface as well as for peripheral driving circuits of an active matrix type liquid crystal display for example.

At first, a silicon oxide film or a silicon oxide nitride film is formed as an underlying film 502 on a glass substrate 501 as shown in FIG. 5A. It is preferable to use the silicon oxide nitride film.

Next, an amorphous silicon film not shown is formed by the plasma CVD or reduced pressure thermal CVD. Then; the amorphous silicon film is transformed into a crystal silicon film by the same method as shown in the first embodiment.

Next, a plasma treatment is implemented within an atmosphere in which oxygen and hydrogen are mixed. Then, the obtained crystal silicon film is patterned to obtain active layers 503 and 504. Thus, the state shown in FIG. 5A is obtained.

It is noted that a heat treatment is implemented at 650° C. for 10 hours within a nitrogen atmosphere containing 3% of HCl in the state shown in FIG. 5A in order to suppress the influence of carriers moving the sides of the active layers.

Because an OFF current characteristic becomes bad if a trap level exists due to the existence of metal element on the sides of the active layers, it is effective to implement the above-mentioned treatment to lower the level on the sides of the active layers.

Further, a thermal oxide film 500 and a silicon oxide nitride film 505 which compose a gate insulating film are formed. When quartz is used as the substrate here, it is desirable to compose the gate insulating film only by the thermal oxide film formed by using the above-mentioned thermal oxidation.

Next, an aluminum film not shown which composes a gate electrode later is formed in a thickness of 4000 angstrom. Beside the aluminum film, a metal which can be anodized (e.g. tantalum) may be used.

After forming the aluminum film, a very thin and dense anodic oxide film is formed on the surface thereof by the method described before.

Next, a resist mask not shown is placed on the aluminum film to pattern the aluminum film. Then, anodization is implemented by setting the obtained aluminum pattern as the anode to form porous anodic oxide films 508 and 509. The thickness of the porous anodic oxide films is 5000 angstrom for example.

Then, another anodization is implemented under the condition of forming dense anodic oxide films to form dense anodic films 510 and 511. The thickness of the dense anodic oxide films 510 and 511 is 800 angstrom. Thus, the state shown in FIG. 5B is obtained.

Then, the exposed silicon oxide film 505 and the thermal oxide film 500 are eliminated by dry etching, thus obtaining the state shown in FIG. 5C.

After obtaining the state shown in FIG. 5C, the porous anodic oxide films 508 and 509 are eliminated by using mixed acid in which acetic acid, nitric acid and phosphoric acid are mixed. Thus, the state shown in FIG. 5D is obtained.

Here, resist masks are disposed alternately to inject P (phosphorus) ions to the thin film transistor on the left side and B (boron) ions to the thin film transistor on the right side.

By injecting those impurity ions, a source domain 514 and a drain domain 517 having N-type in high concentration are formed in a manner of self-adjustment.

Further, a domain 515 to which P ions are doped in low concentration, thus having weak N-type, as well as a channel forming domain 516 are formed in the same time.

The reason why the domain 515 having the weak N-type is formed is because the remaining gate insulating film 512 exists. That is, part of P ions transmitting through the gate insulating film 512 is blocked by the gate insulating film 512.

By the same principle, a source domain 521 and a drain domain 518 having strong P-type are formed in a manner of self-adjustment and a low concentrate impurity domain 520 is formed in the same time. Further, a channel forming domain 519 is formed in the same time.

It is noted that when the thickness of the dense anodic oxide films 510 and 511 is as thick as 2000 angstrom, an offset gate domain may be formed in contact with the channel forming domain by that thickness.

Its existence may be ignored in the case of the present embodiment because the dense anodic oxide films 510 and 511 are so thin as less than 1000 angstrom.

Then, laser light or intense light is irradiated to anneal the domain into which the impurity ions have been injected.

Then, a silicon nitride film 522 and a silicon oxide film 523 are formed as interlayer insulating films as shown in FIG. 5E. Their thickness is 1000 angstrom, respectively. It is noted that the silicon oxide film 523 needs not be formed.

Here, the thin film transistor is covered by the silicon nitride film. The reliability of the thin film transistor may be enhanced by arranging as described above because the silicon nitride film is dense and has a favorite interfacial characteristic.

Further, an interlayer insulating film 524 made of a resin material is formed by means of spin coating. Here, the thickness of the interlayer insulating film 524 is 1 µm FIG. 5E).

Then, contact holes are created to form a source electrode 525 and a drain electrode 526 of the N-channel type thin film transistor on the left side. In the same time, a source electrode 527 and the drain electrode 526 of the thin film transistor on the right side are formed. Here, the electrode 526 is disposed in common.

Thus, the thin film transistor circuit having a CMOS structure constructed in a complementary manner may be formed.

According to the arrangement shown in the present embodiment, the thin film transistor is covered by the nitride film as well as the resin material. This arrangement allows to enhance the durability of the thin film transistor to which movable ions nor moisture hardly infiltrate.

Further, it allows to prevent capacitance from being generated between the thin film transistor and wires when a multi-layered wire is formed.

Tenth Embodiment

The present embodiment relates to a case of forming a mono-crystal domain or a domain which can be substantially considered as a mono-crystal domain by irradiating laser light to the crystal silicon film obtained in the first or second embodiment.

At first, the crystal silicon film is obtained by utilizing the action of nickel element as shown in the first embodiment. Next, excimer laser (e.g. KrF excimer laser) is irradiated to the film to promote crystallization thereof further. At this time, the mono-crystal domain or the domain which can be substantially considered as a mono-crystal domain may be formed by using a heat treatment in the temperature range of more than 450° C., and by optimizing the condition for irradiating the laser light.

The film whose crystallization has been greatly promoted by such method has a domain which can be considered as a mono-crystal in which an electron spin density measured by ESR is less than $3\times10^{17}$ cm$^{-3}$ and the concentration of nickel element as the minimum value measured by SIMS is less than $3\times10^{17}$ cm$^{-3}$.

Substantially no grain boundary exists in this domain and high electrical characteristics equivalent to a mono-crystal silicon wafer can be obtained.

Further, the domain which can be considered as a mono-crystal contains hydrogen by less than 5 atom % to $1\times10^{15}$ cm$^{-3}$. This value is clarified by the measurement carried out by the SIMS (secondary ion mass spectrometry).

By fabricating a thin film transistor by utilizing such mono-crystal or the domain which can be substantially considered as a mono-crystal, a semiconductor device which is equivalent to a MOS type transistor fabricated by using a mono-crystal wafer may be obtained.

Eleventh Embodiment

The present embodiment relates to a case when nickel element is introduced directly to the surface of the underlying film in the process shown in the first embodiment. In this case, the nickel element is held in contact with the lower surface of the amorphous silicon film.

In this case, nickel element is introduced after forming the underlying film such that the nickel element (metal element) is held in contact with the surface of the underlying film. Beside the method of using the solution, sputtering, CVD or adsorption may be used as the method for introducing nickel element.

Twelfth Embodiment

In the present embodiment, the effect of gettering nickel, by the action of chlorine, from the crystal silicon film which has been crystallized by the action of nickel based on experimental data.

FIG. 6 shows a measured result of the distribution of concentration of nickel element in a direction of section of the crystal silicon film obtained by utilizing nickel. The measurements were obtained by SIMS (secondary ion mass spectrometry).

It is noted that the measured data around the surface is not significant because it is influenced by the irregularity and adsorbed substances on the surface. The data around the interface also contains errors more or less by the same reason.

Steps for fabricating the sample from which these measured values have been obtained will be explained below briefly. An silicon oxide film is formed as an underlying film in a thickness of 4000 angstrom on a quartz substrate and then an amorphous silicon film is formed in a thickness of 500 angstrom by reduced pressure thermal CVD.

Next, nickel element is introduced to the amorphous silicon film by the method using nickel acetate aqueous solution as shown in the first embodiment. Further, the amorphous silicon film is crystallized by a heat treatment at 650° C. for four hours to obtain a crystal silicon film.

Then, another heat treatment is implemented within an oxidizing atmosphere at 950° C. to form a thermal oxide film 500 angstrom thick.

As it is apparent from FIG. 6, the nickel element exists within the crystal silicon film (poly-Si film) in high concentration (as compared to other domains). It is noted that the reason why the concentration of nickel element is high on the surface of the thermal oxide film is considered to be measurement errors caused by the state of the surface, so that it is not significant.

Next, FIG. 7 shows measured data of a sample of another method for forming the thermal oxide film implemented within an oxygen atmosphere containing 3% of HCl at 950° C.

As it is apparent from FIG. 7, the concentration of nickel within the crystal silicon film (poly-Si) is reduced and instead of that, the concentration of nickel within the thermal oxide film is increased. This means that the nickel element has been suctioned out (i.e. gettered) to the thermal oxide film.

The difference between FIG. 6 and FIG. 7 is only whether HCl has been contained within the atmosphere in forming the thermal oxide film. Accordingly, it can be concluded that the above-mentioned effect of gettering is brought about by HCl. Further, because no gettering effect is confirmed by H, it can be concluded that, more accurately, the gettering effect as indicated by the difference between FIG. 6 and FIG. 7 can be obtained by the action of Cl (chlorine).

Further, it can be seen that the crystal silicon film in which the nickel concentration has been reduced can be obtained by eliminating the thermal oxide film which has gettered the nickel element.

FIG. 8 shows the distribution of concentration of Cl element in a sample fabricated under the same condition with that of the sample from which the data in FIG. 7 has been obtained. As it is apparent from FIG. 8, the Cl element is concentrated near the interface between the crystal silicon film and the thermal oxide film.

Thirteenth Embodiment

The present embodiment is related to a case when an amorphous silicon film formed by plasma CVD is utilized as the starting film of the crystal silicon film from which the data described in the twelfth embodiment has been obtained. Because the quality of the amorphous silicon film formed by the plasma CVD is different from that of the amorphous silicon film formed by the reduced pressure thermal CVD, the action of gettering is also different as described later.

FIG. 9 shows data for comparison. FIG. 9 shows measured data of a sample when the thermal oxide film has been formed in an oxygen atmosphere at 950° C. As it is apparent from FIG. 9, the nickel element exists relatively in high concentration within the crystal silicon film (poly-Si).

It is noted that although the condition for introducing nickel is the same, the nickel concentration is high within the crystal silicon film (poly-Si) as compared to that in FIG. 6. It is assumed to have happened because the nickel element can readily diffuse within the film because the quality of the amorphous silicon film formed by the plasma CVD is not dense and has many defects.

The above-mentioned fact may be seen from another point of view as follows. That is, while a very thin oxide film has been formed on the surface of the amorphous silicon film by means of UV oxidation before applying the nickel acetate aqueous solution, there is a possibility that the thickness of the oxide film have become different by receiving an influence of difference of the quality of the underlying amorphous silicon film. It can be understood that because the amount of nickel element which diffuses within the silicon film is different depending on the difference of the thickness in this case, its effect has appeared as the difference between FIG. 6 and FIG. 9.

FIG. 10 shows data when 1% of HCl is contained in oxygen as the atmosphere in forming the thermal oxide film. As it is apparent from FIG. 10, the nickel concentration within the crystal silicon film (Poly-Si) drops further as compared to the data shown in FIG. 9. In contrary to that, the nickel concentration within the thermal oxide film has increased.

This fact means that the nickel element has been gettered to the thermal oxide film by the action of chlorine. Thus, the nickel element existing within the silicon film may be gettered effectively to the thermal oxide film by forming the thermal oxide film within the oxidizing atmosphere containing chlorine.

Accordingly, the crystal silicon film in which the nickel concentration is reduced may be obtained by eliminating the thermal oxide film which has gettered the nickel element.

FIG. 11 shows a result obtained by studying the concentration of chlorine within a sample obtained under the same fabrication condition with that of the sample from which the data shown in FIG. 10 has been obtained. As it is apparent from FIG. 11, chlorine exists in high concentration near the interfaces between the underlying film and the crystal silicon film and between the crystal silicon film and the thermal oxide film.

While FIG. 11 corresponds to FIG. 8, the reason why the chlorine concentration is distributed as shown in FIG. 11 is considered to happen because the amorphous silicon film which is the starting film has been formed by the plasma CVD and the quality thereof is not dense.

As it is also apparent from FIG. 10, the nickel concentration is apt to be high also near the interface between the underlying film and the crystal silicon film. It is understood to happen as a result that nickel has been gettered to the underlying film by the action of chlorine existing near the interface with the underlying film (or within the underlying film).

Such phenomenon is considered to be obtained also when a halogen element is added to the underlying film.

EFFECTS OF THE INVENTION

The use of the invention disclosed in the present specification allows to provide the technology for reducing the concentration of metal element within the crystal silicon film which has been obtained by utilizing the metal element which promotes the crystallization of silicon.

The use of this technology also allows a more reliable and higher performance thin film semiconductor device to be obtained.

BRIEF DESCRIPTION OF REFERENCE NUMERALS

Figure 1A:
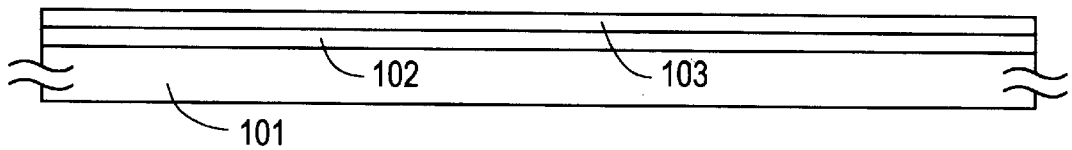
FIG. 1 is a diagram showing steps for obtaining a crystal silicon film.
Figure 1B:
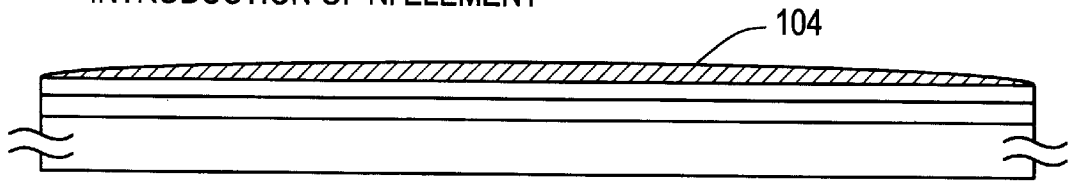
Figure 1C:
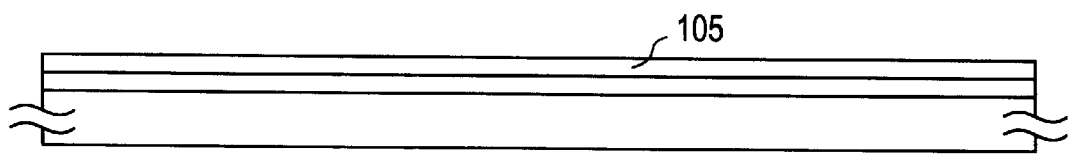
Figure 1D:
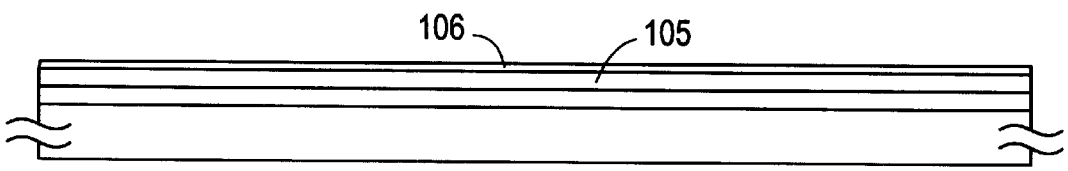
Figure 1E:
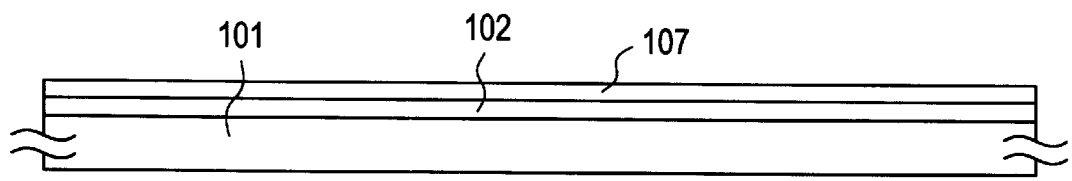
Figure 2A:
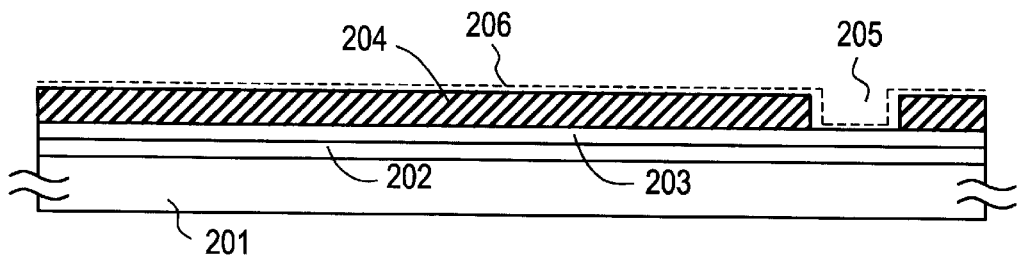
FIG. 2 is a diagram showing steps for obtaining a crystal silicon film.
Figure 2B:
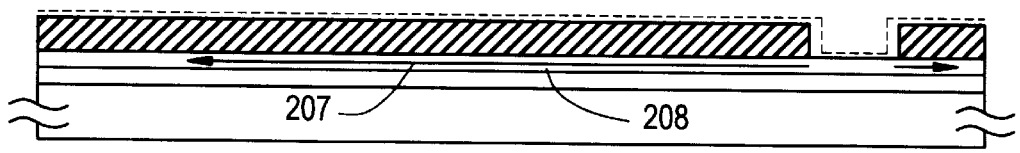
Figure 2C:
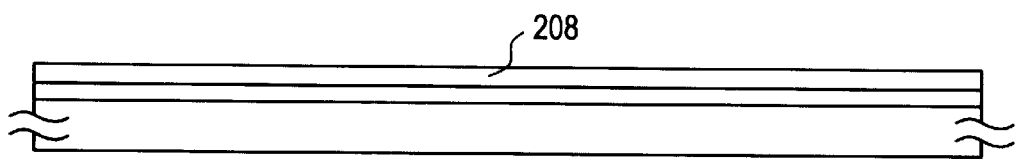
Figure 2D:
Figure 2E:
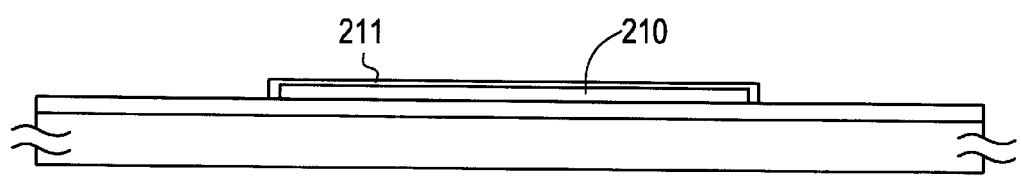
Figure 3A:
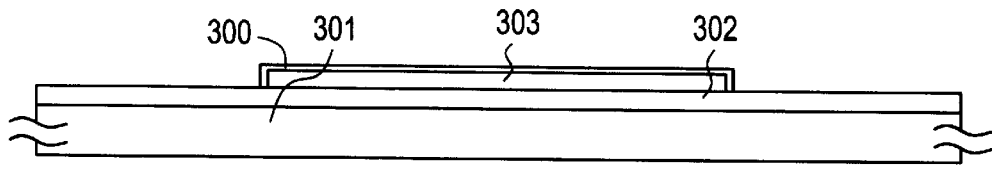
FIG. 3 is a diagram showing steps for fabricating a thin film transistor.
Figure 3B:
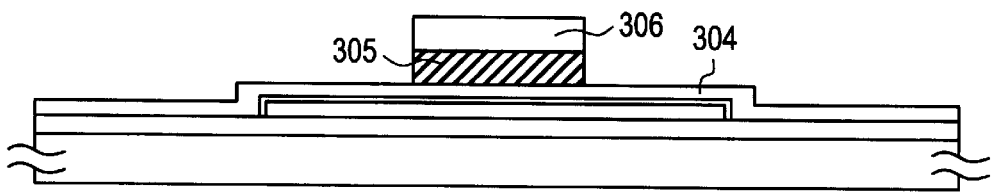
Figure 3C:
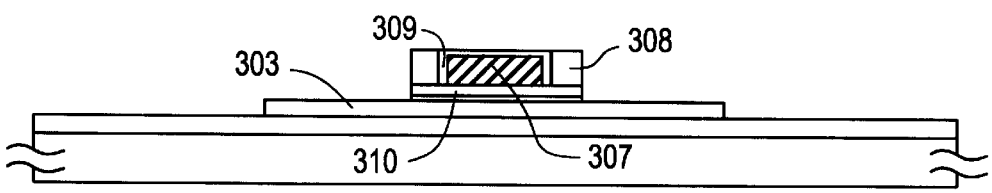
Figure 3D:
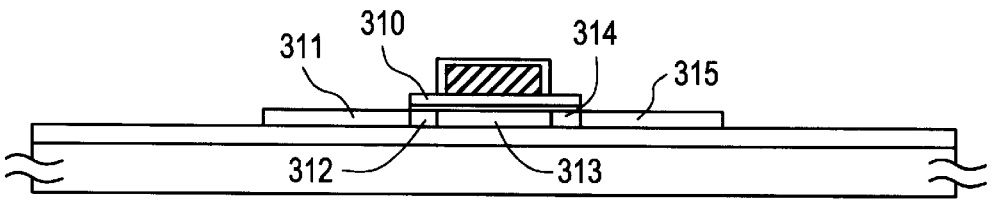
Figure 3E:
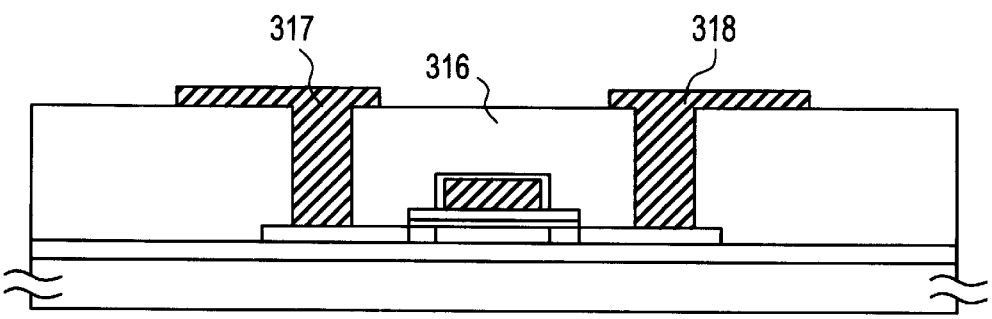
Figure 4A:
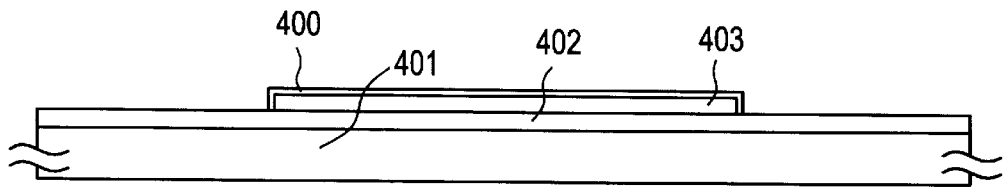
FIG. 4 is a diagram showing steps for fabricating a thin film transistor.
Figure 4B:
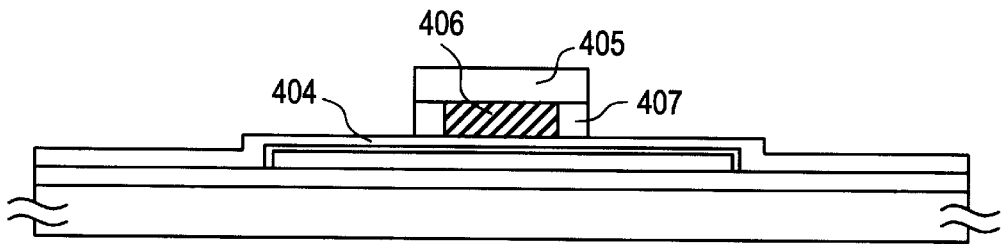
Figure 4C:
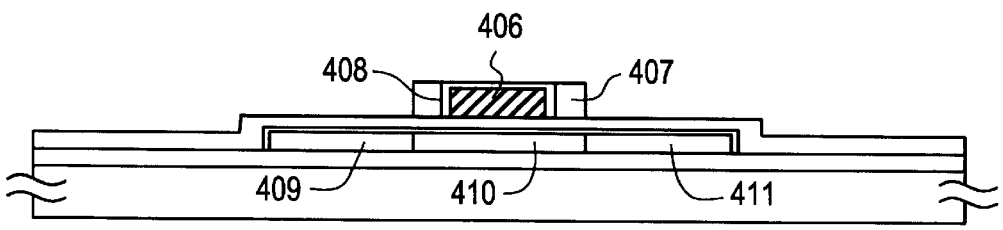
Figure 4D:
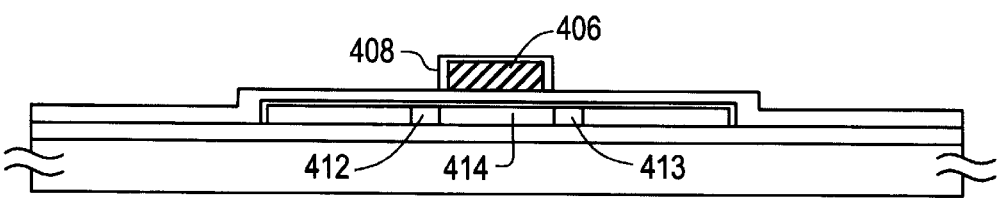
Figure 4E:
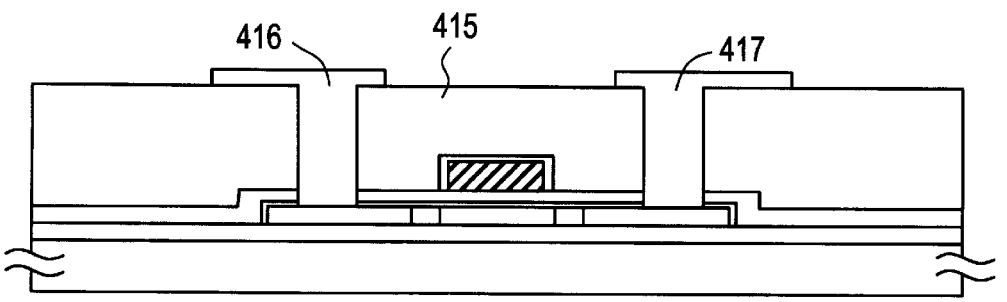
Figure 5A:
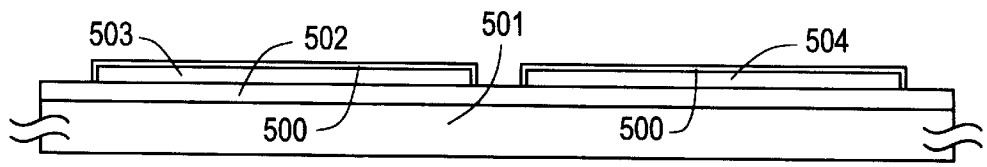
FIG. 5 is a diagram showing steps for fabricating a thin film transistor.
Figure 5B:
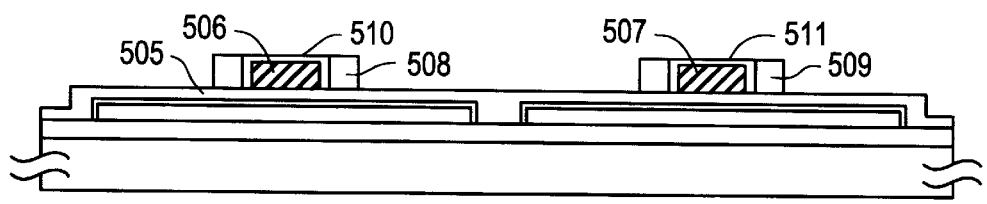
Figure 5C:
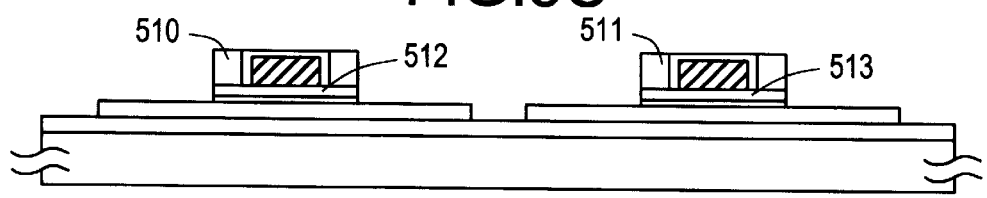
Figure 5D:
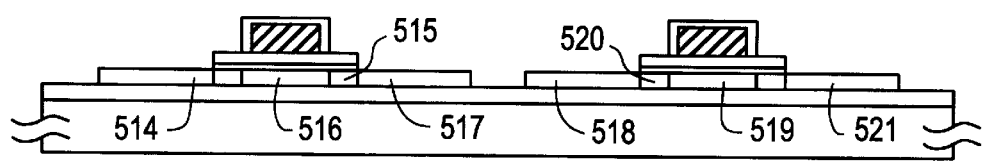
Figure 5E:
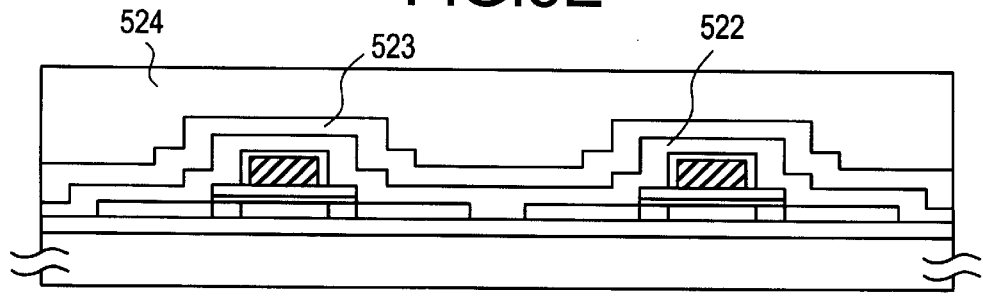
Figure 5F:
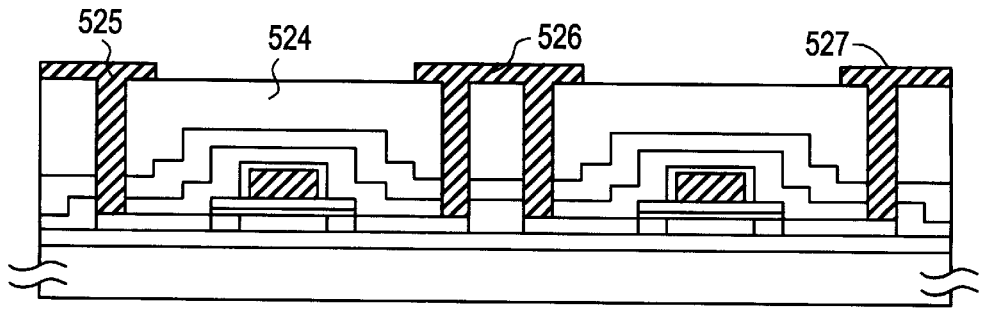
Figure 6:
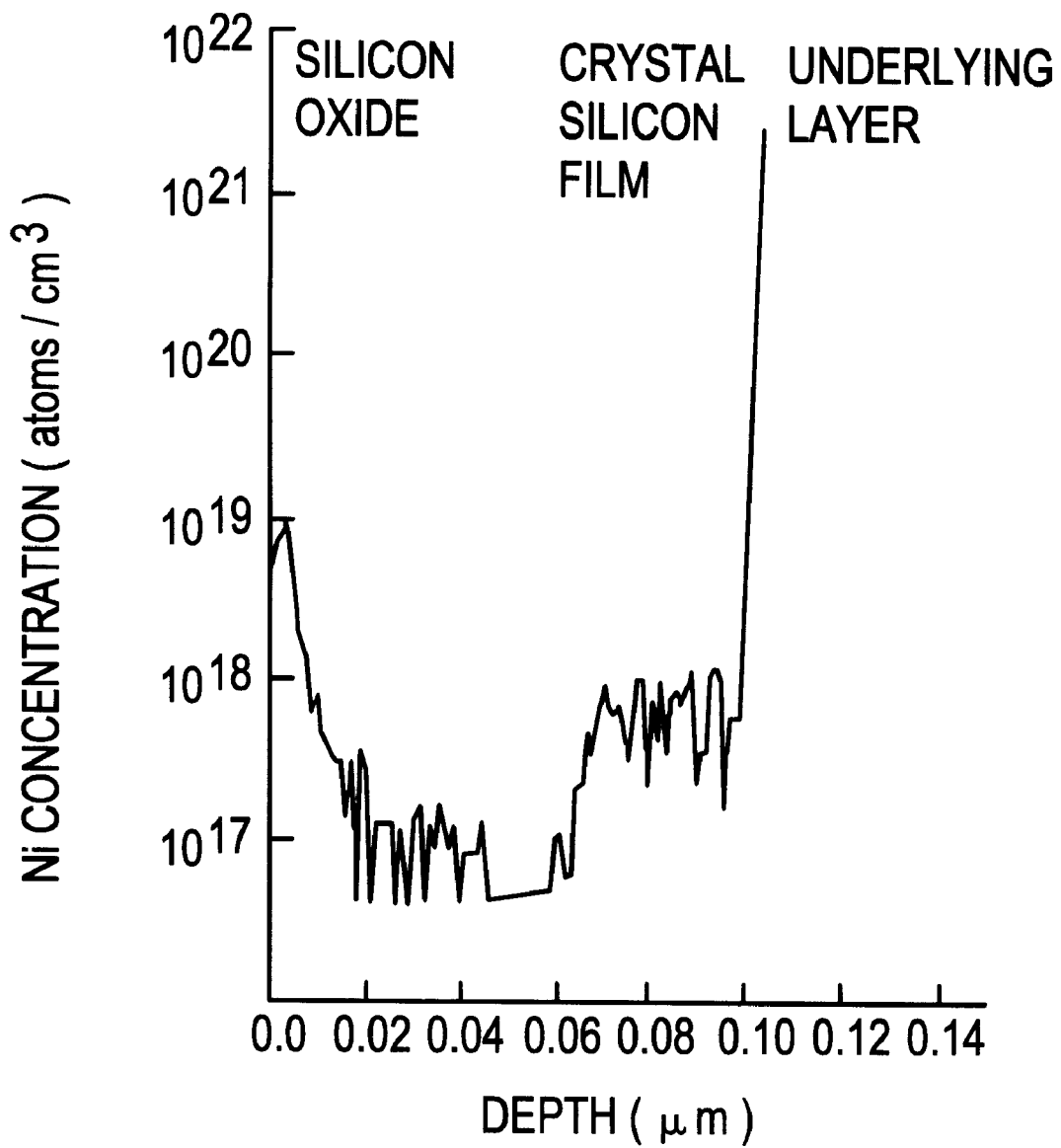
FIG. 6 is a graph showing distribution of concentration of nickel element.
Figure 7:
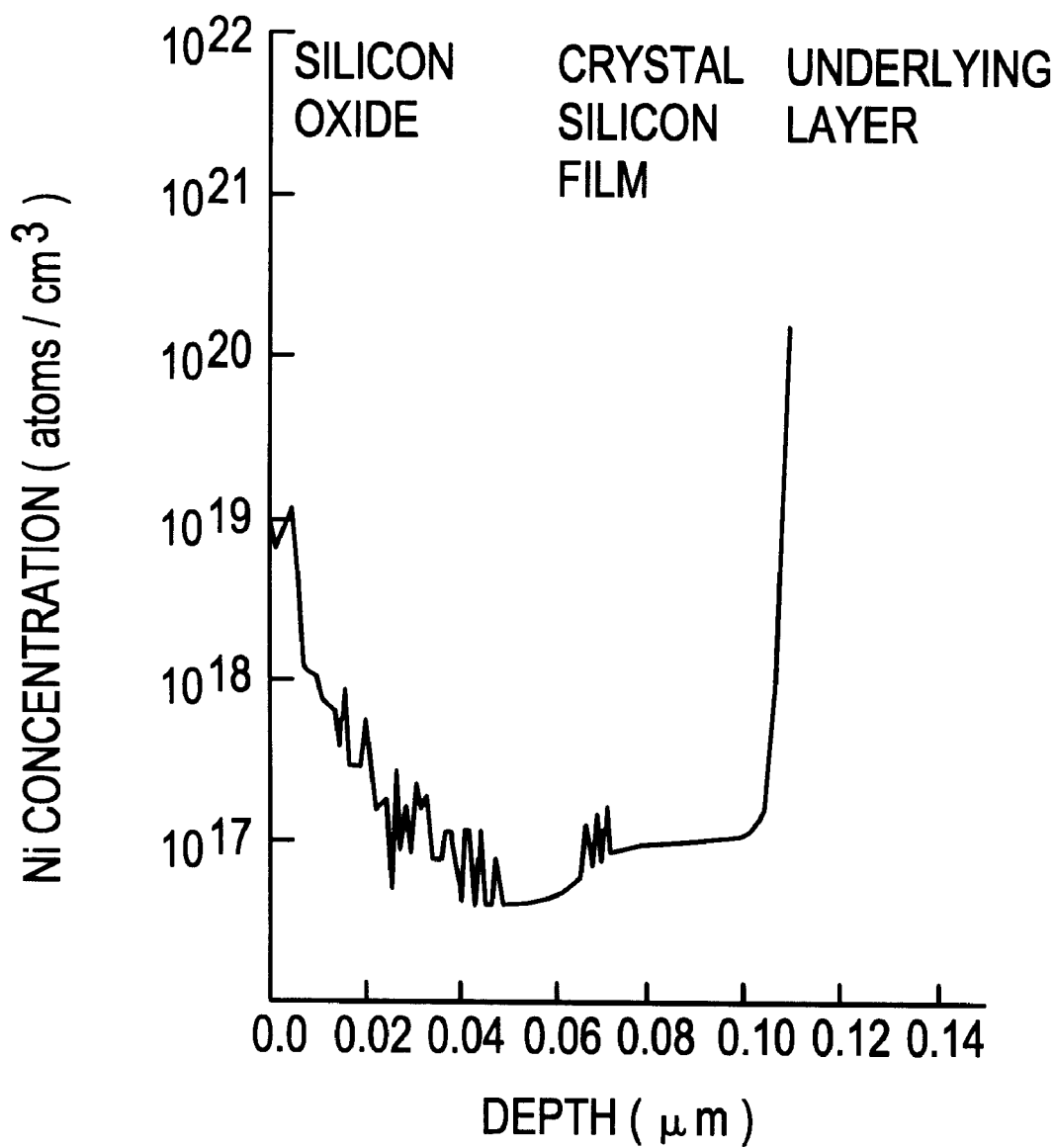
FIG. 7 is a graph showing a distribution of concentration of nickel element.
Figure 8:
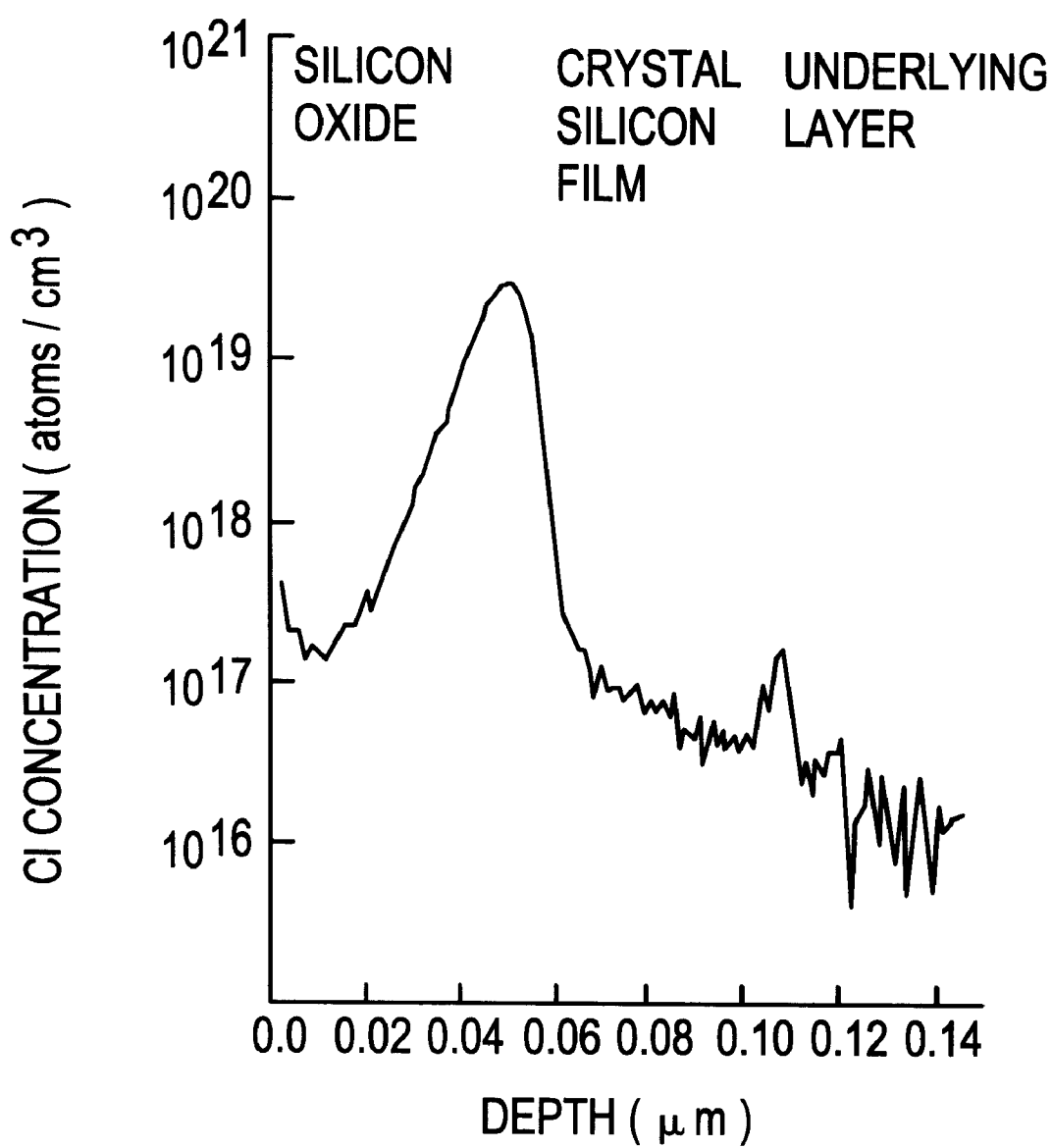
FIG. 8 is a graph showing a distribution of concentration of chlorine element.
Figure 9:
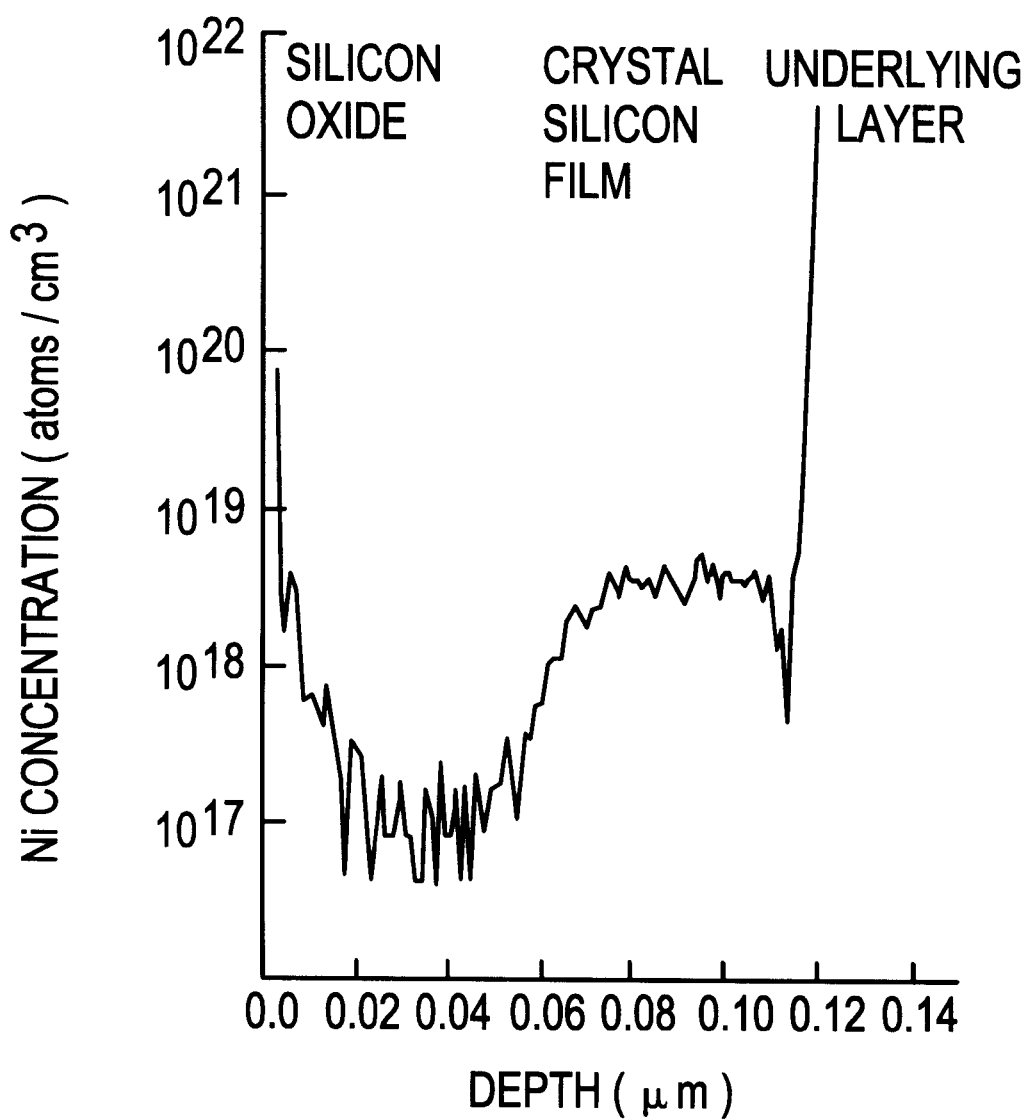
FIG. 9 is a graph showing a distribution of concentration of nickel element.
Figure 10:
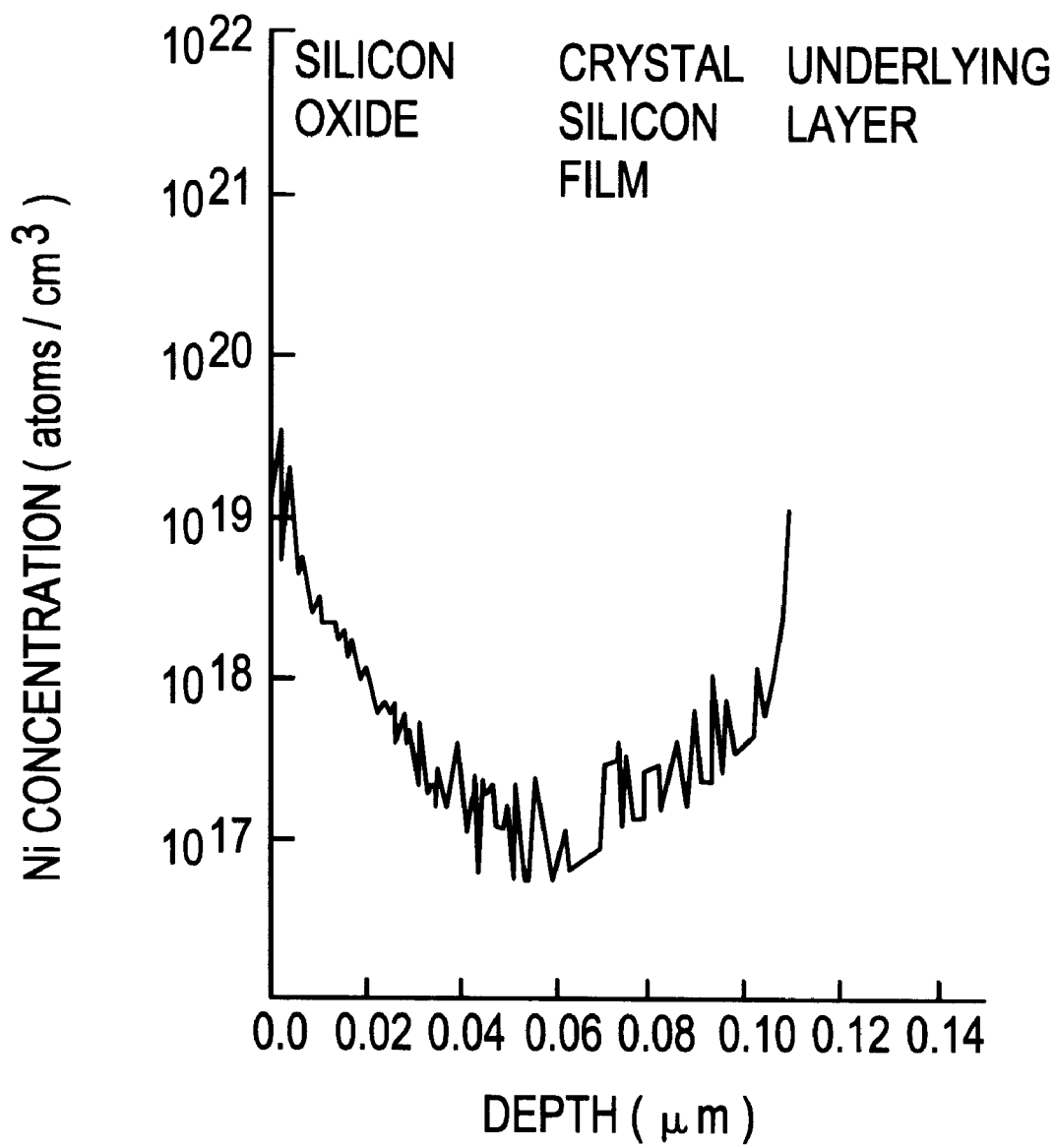
FIG. 10 is a graph showing a distribution of concentration of nickel element.
Figure 11:
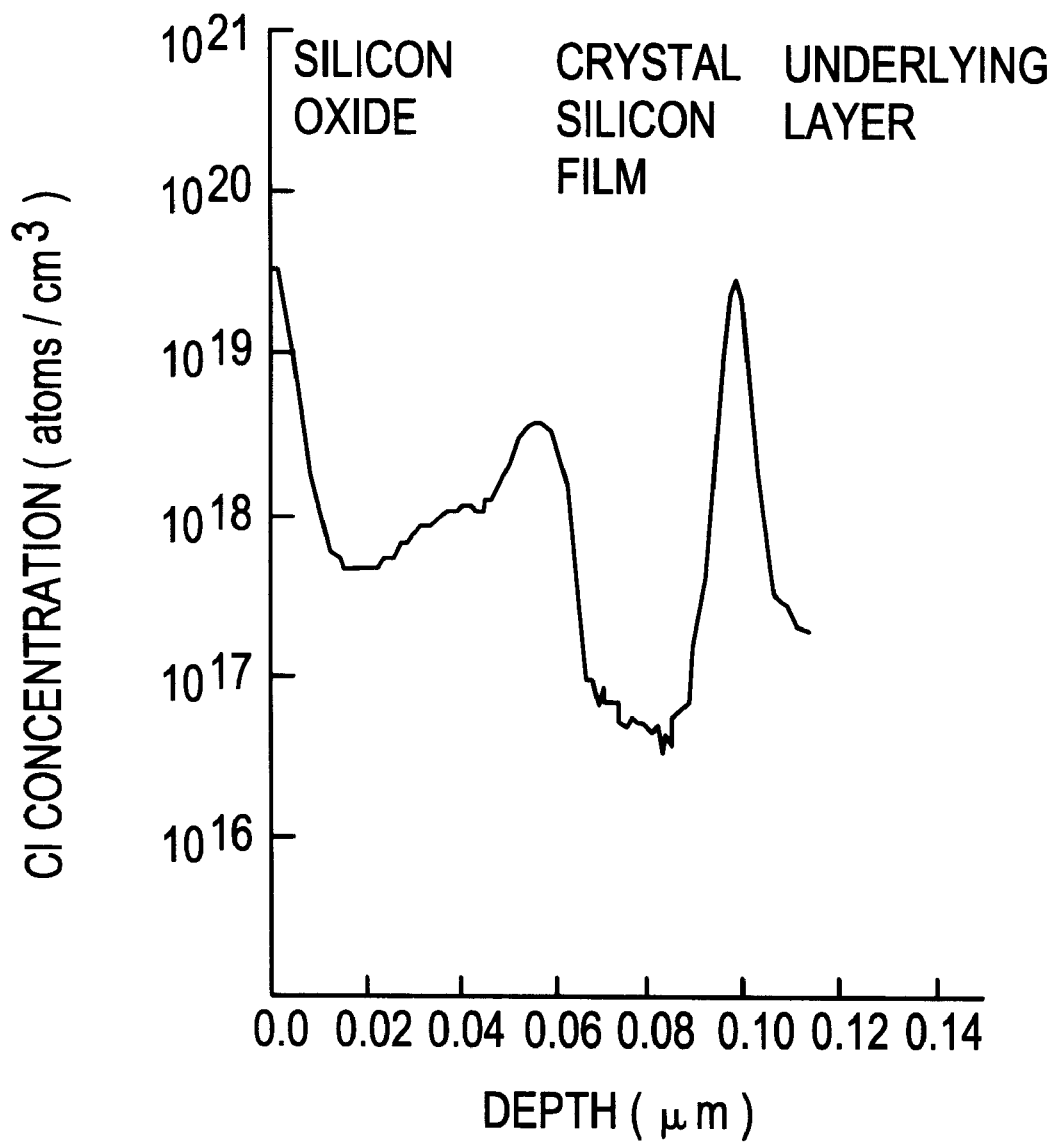
FIG. 11 is a graph showing a distribution of concentration of chlorine element.

101: Glass Substrate or Quartz Substrate
102: Underlying Layer (Silicon Oxide Film or Silicon Oxide Nitride Film)
103: Amorphous Silicon Film
104: Aqueous Film of Solution Containing Nickel
105: Crystal Silicon Film
106: Thermal Oxide Film
107: Crystal Silicon Film in Which Concentration of Nickel Element Has Been Reduced
201: Glass Substrate or Quartz Substrate
202: Underlying Layer (Silicon Oxide Film or Silicon Oxide Nitride Film)
203: Amorphous Silicon Film
204: Mask Made of Silicon Oxide Film
205: Aperture
206: Nickel Held in Contact
207: Direction of Crystal Growth In parallel to Substrate
208: Silicon Film
209: Thermal Oxide Film
210: Patterned Silicon Film

What is claimed is:

1. An active matrix type EL display device comprising:
   a substrate having an insulating surface;
   at least one thin film transistor formed on said insulating surface, said thin film transistor having a crystalline semiconductor layer comprising at least source, drain, and channel regions, first and second gate insulating films, and a gate electrode;
   an interlayer insulating film comprising inorganic material over said thin film transistor;
   a layer comprising resin material over said thin film transistor with said interlayer insulating film interposed therebetween; and
   at least one electrode electrically connected to said drain region of the thin film transistor through a contact hole provided in at least said layer comprising said resin material.

2. A device according to claim 1, wherein said insulating surface has a function of suppressing diffusion of impurities from said substrate.

3. A device according to claim 1, wherein said thin film transistor is a top gate type.

4. A device according to claim 1, wherein said crystalline semiconductor layer further comprises a pair of LDD regions.

5. A device according to claim 1, wherein said crystalline semiconductor layer including a metal element for promoting crystallization of said semiconductor at a concentration of $3\times10^{17}$ cm$^{-3}$ or less.

6. A device according to claim 1, wherein an electron spin density measured by ESR of said crystalline semiconductor layer is less than $3\times10^{17}$ cm$^{-3}$.

7. An active matrix type EL display device comprising:
   a substrate having an insulating surface;
   a crystalline semiconductor layer comprising at least source, drain, and channel regions over said substrate;
   first and second gate insulating films adjacent to said crystalline semiconductor layer, said first gate insulating film comprising a thermal oxide film of said semiconductor layer;
   at least one gate electrode adjacent to said channel region with said first and second gate insulating films interposed therebetween;
   an interlayer insulating film comprising inorganic material over said crystalline semiconductor layer and said gate electrode;
   a layer comprising resin material over said crystalline semiconductor layer and said gate electrode with said interlayer insulating film interposed therebetween; and
   at least one electrode electrically connected to said drain region through a contact hole provided in at least said layer comprising said resin material.

8. A device according to claim 7, wherein said insulating surface has a function of suppressing diffusion of impurities from said substrate.

9. A device according to claim 7, wherein said second gate insulating film includes at least one halogen element.

10. A device according to claim 7, wherein said gate electrode is located over said crystalline semiconductor layer.

11. A device according to claim 7, wherein said second gate insulating film is selected from the group consisting of a silicon oxynitride film and a silicon oxide film.

12. A device according to claim 7, wherein said crystalline semiconductor layer further comprises a pair of LDD regions.

13. A device according to claim 7, wherein said crystalline semiconductor layer including a metal element for promoting crystallization of said semiconductor at a concentration of $3\times10^{17}$ cm$^{-3}$ or less.

14. A device according to claim 7, wherein an electron spin density of said crystalline semiconductor measured by ESR is less than $3\times10^{17}$ cm$^{-3}$.

15. An active matrix type EL display device comprising:
    a substrate having an insulating surface;
    at least one thin film transistor formed on said insulating surface, said thin film transistor having a crystalline semiconductor layer comprising at least source, drain, and channel regions, first and second gate insulating films, and a gate electrode;
    an interlayer insulating film over said thin film transistor, said interlayer insulating film being selected from the group consisting of a silicon oxide film, a silicon nitride film, and a lamination film thereof;
    a layer comprising resin material over said thin film transistor with said interlayer insulating film interposed therebetween; and
    at least one electrode electrically connected to the drain region of the thin film transistor through a contact hole provided in at least said layer comprising said resin material.

16. A device according to claim 15, wherein said insulating surface has a function of suppressing diffusion of impurities from said substrate.

17. A device according to claim 15, wherein said thin film transistor is a top gate type.

18. A device according to claim 15, wherein said crystalline semiconductor layer further comprises a pair of LDD regions.

19. A device according to claim 15, wherein said crystalline semiconductor layer including a metal element for promoting crystallization of said semiconductor at a concentration of $3\times10^{17}$ cm$^{-3}$ or less.

20. A device according to claim 15, wherein an electron spin density measured by ESR of said crystalline semiconductor layer is less than $3\times10^{17}$ cm$^{-3}$.

21. An active matrix type EL display device comprising:
    a substrate having an insulating surface;
    a crystalline semiconductor layer comprising at least source, drain, and channel regions over said substrate;
    first and second gate insulating films adjacent to said crystalline semiconductor layer, said first gate insulating film comprising a thermal oxide film of said semiconductor layer;
    at least one gate electrode adjacent to said channel region with said first and second gate insulating films interposed therebetween;
    an interlayer insulating film over said crystalline semiconductor layer and said gate electrode, said interlayer insulating film being selected from the group consisting of a silicon oxide film, a silicon nitride film, and a lamination film thereof;
    a layer comprising resin material over said crystalline semiconductor layer and said gate electrode with said interlayer insulating film interposed therebetween; and
    at least one electrode electrically connected to said drain region through a contact hole provided in at least said layer comprising said resin material.

22. A device according to claim 21, wherein said insulating surface has a function of suppressing diffusion of impurities from said substrate.

23. A device according to claim 21, wherein said second gate insulating film includes at least one halogen element.

24. A device according to claim 21, wherein said gate electrode is located over said crystalline semiconductor layer.

25. A device according to claim 21, wherein said second gate insulating film is selected from the group consisting of a silicon oxynitride film and a silicon oxide film.

26. A device according to claim 21, wherein said crystalline semiconductor layer further comprises a pair of LDD regions.

27. A device according to claim 21, wherein said crystalline semiconductor layer including a metal element for promoting crystallization of said semiconductor at a concentration of $3\times10^{17}$ cm$^{-3}$ or less.

28. A device according to claim 21, wherein an electron spin density of said crystalline semiconductor measured by ESR is less than $3\times10^{17}$ cm$^{-3}$.

29. An active matrix type EL display device comprising:
    a substrate having an underlayer insulating film;
    at least one thin film transistor formed on said underlayer insulating film, said thin film transistor having a crystalline semiconductor layer comprising at least source, drain, and channel regions, first and second gate insulating films, and a gate electrode;
    an interlayer insulating film comprising inorganic material over said thin film transistor;
    a layer comprising resin material over said thin film transistor with said interlayer insulating film interposed therebetween; and
    at least one electrode electrically connected to said drain region of the thin film transistor through a contact hole provided in at least said layer comprising said resin material,
    wherein said underlayer insulating film has a function of suppressing diffusion of impurities from said substrate.

30. A device according to claim 29, wherein said underlayer insulating film is selected from the group consisting of a silicon oxynitride film and a silicon oxide film.

31. A device according to claim 29 wherein said thin film transistor is a top gate type.

32. A device according to claim 29 wherein said crystalline semiconductor layer further comprises a pair of LDD regions.

33. A device according to claim 29, wherein said interlayer insulating film is selected from the group consisting of a silicon oxide film, a silicon nitride film, and a lamination film thereof.

34. A device according to claim 29, wherein said crystalline semiconductor layer including a metal element for promoting crystallization of said semiconductor at a concentration of $3\times10^{17}$ cm$^{-3}$ or less.

35. A device according to claim 29, wherein an electron spin density measured by ESR of said crystalline semiconductor layer is less than $3\times10^{17}$ cm$^{-3}$.

36. An active matrix type EL display device comprising an active matrix region over a substrate having an insulating surface, said active matrix region comprising:
    at least one first thin film transistor formed on said insulating surface, said first thin film transistor having a crystalline semiconductor layer comprising at least source, drain, and channel regions, at least one LDD region, first and second gate insulating films, and a gate electrode;
    an interlayer insulating film comprising inorganic material over said first thin film transistor;
    a layer comprising resin material over said first thin film transistor with said interlayer insulating film interposed therebetween; and
    at least one electrode electrically connected to said drain region of the thin film transistor through a contact hole provided in at least said layer comprising said resin material.

37. A display according to claim 36, wherein said first gate insulating film is a thermal oxide film of said semiconductor layer and said second gate insulating film is a deposit film.

38. A display according to claim 36, wherein said interlayer insulating film comprises at least silicon and nitrogen.

39. An active matrix type EL display device comprising an active matrix region over a substrate having an insulating surface, said active matrix region comprising:
    a first crystalline semiconductor layer comprising at least source, drain, and channel regions, and at least one LDD region over said substrate;
    first and second gate insulating films adjacent to said first crystalline semiconductor layer, said first gate insulating film comprising a thermal oxide film of said semiconductor layer;
    at least one first gate electrode adjacent to said channel region of said first crystalline semiconductor layer with said first and second gate insulating films interposed therebetween;
    an interlayer insulating film comprising inorganic material over said first crystalline semiconductor layer and said first gate electrode;
    a layer comprising resin material over said first crystalline semiconductor layer and said first gate electrode with said interlayer insulating film interposed therebetween; and
    at least one electrode electrically connected to said drain region of said first crystalline semiconductor layer through a contact hole provided in at least said layer comprising said resin material.

40. A device according to claim 39, wherein said second gate insulating film is selected from the group consisting of a silicon oxynitride film and a silicon oxide film.

41. A device according to claim 39, wherein said interlayer insulating film comprises at least silicon and nitrogen.

42. An active matrix type EL display device comprising an active matrix region over a substrate having an insulating surface, said active matrix region comprising:
    at least one first thin film transistor formed on said insulating surface, said first thin film transistor having a crystalline semiconductor layer comprising at least source, drain, and channel regions, at least one LDD region, first and second gate insulating films, and a gate electrode;
    an interlayer insulating film over said first thin film transistor, said interlayer insulating film being selected from the group consisting of a silicon oxide film, a silicon nitride film, and a lamination film thereof;
    a layer comprising resin material over said first thin film transistor with said interlayer insulating film interposed therebetween; and
    at least one electrode electrically connected to the drain region of the first thin film transistor through a contact hole provided in at least said layer comprising said resin material.

43. A display according to claim 42, wherein said first gate insulating film is a thermal oxide film of said semiconductor layer and said second gate insulating film is a deposit film.

44. A display according to claim 42, wherein said gate electrode is located over said crystalline semiconductor layer.

45. An active matrix type EL display device comprising an active matrix region over a substrate having an insulating surface, said active matrix region comprising:
- a first crystalline semiconductor layer comprising at least source, drain, and channel regions, and at least one LDD region over said insulating surface;
- first and second gate insulating films adjacent to said first crystalline semiconductor layer, said first gate insulating film comprising a thermal oxide film of said semiconductor layer;
- at least one first gate electrode adjacent to said channel region of said first crystalline semiconductor layer with said first and second gate insulating films interposed therebetween;
- an interlayer insulating film over said first crystalline semiconductor layer and said first gate electrode, said interlayer insulating film being selected from the group consisting of a silicon oxide film, a silicon nitride film, and a lamination film thereof;
- a layer comprising resin material over said first crystalline semiconductor layer and said first gate electrode with said interlayer insulating film interposed therebetween; and
- at least one electrode electrically connected to said drain region of said first crystalline semiconductor layer through a contact hole provided in at least said layer comprising said resin material.

46. A device according to claim 45, wherein said second gate insulating film is selected from the group consisting of a silicon oxynitride film and a silicon oxide film.

47. A device according to claim 45, wherein said gate electrode is located over said crystalline semiconductor layer.

48. An active matrix type EL display device comprising an active matrix region over a substrate having an underlayer insulating film, said active matrix region comprising:
- at least one first thin film transistor formed on said underlayer insulating film, said first thin film transistor having a crystalline semiconductor layer comprising at least source, drain, and channel regions, at least one LDD region, first and second gate insulating films, and a gate electrode;
- an interlayer insulating film comprising inorganic material over said first thin film transistor;
- a layer comprising resin material over said first thin film transistor with said interlayer insulating film interposed therebetween; and
- at least one electrode electrically connected to said drain region of the first thin film transistor through a contact hole provided in at least said layer comprising said resin material,
- wherein said underlayer insulating film has a function of suppressing diffusion of impurities from said substrate.

49. A display according to claim 48, wherein said first gate insulating film is a thermal oxide film of said semiconductor layer and said second gate insulating film is a deposit film.

50. A display according to claim 48, wherein said interlayer insulating film comprises at least silicon and nitrogen.

* * * * *